United States Patent
Kwon et al.

(10) Patent No.: US 9,312,014 B2
(45) Date of Patent: Apr. 12, 2016

(54) SINGLE-LAYER GATE EEPROM CELL, CELL ARRAY INCLUDING THE SAME, AND METHOD OF OPERATING THE CELL ARRAY

(71) Applicant: SK HYNIX INC., Icheon (KR)

(72) Inventors: Young Joon Kwon, Cheongju (KR); Sung Kun Park, Cheongju (KR)

(73) Assignee: SK HYNIX INC., Icheon (KR)

( * ) Notice: Subject to any disclaimer, the term of this patent is extended or adjusted under 35 U.S.C. 154(b) by 118 days.

(21) Appl. No.: 14/172,815

(22) Filed: Feb. 4, 2014

(65) Prior Publication Data

US 2014/0293709 A1    Oct. 2, 2014

(30) Foreign Application Priority Data

Apr. 1, 2013  (KR) .................. 10-2013-0035446
May 28, 2013 (KR) .................. 10-2013-0060541

(51) Int. Cl.
| | |
|---|---|
| *G11C 16/04* | (2006.01) |
| *H01L 27/115* | (2006.01) |
| *G11C 16/16* | (2006.01) |

(52) U.S. Cl.
CPC ............ *G11C 16/16* (2013.01); *G11C 16/0441* (2013.01); *H01L 27/1156* (2013.01); *H01L 27/11519* (2013.01); *H01L 27/11558* (2013.01)

(58) Field of Classification Search
CPC ............... G11C 16/16; G11C 16/0441; H01L 27/11519; H01L 27/11558; H01L 27/1156
USPC ............... 365/185.33; 438/211, 213; 257/314
See application file for complete search history.

(56) References Cited

U.S. PATENT DOCUMENTS

| | | | | |
|---|---|---|---|---|
| 4,437,172 A * | 3/1984 | Masuoka | ............ | H01L 29/7885 257/316 |
| 5,594,687 A * | 1/1997 | Lin | ............ | G11C 16/0441 257/E27.103 |
| 5,761,126 A * | 6/1998 | Chi | ............ | G11C 16/0408 257/314 |
| 5,904,524 A * | 5/1999 | Smolen | ............ | H01L 27/115 257/E21.422 |
| 6,191,980 B1 * | 2/2001 | Kelley | ............ | G11C 16/0408 257/E21.694 |
| 6,212,103 B1 * | 4/2001 | Ahrens | ............ | G11C 16/14 257/E27.103 |
| 6,596,587 B1 * | 7/2003 | Mehta | ............ | H01L 21/26506 257/314 |
| 6,627,947 B1 * | 9/2003 | Hu | ............ | H01L 27/115 257/318 |
| 6,667,506 B1 * | 12/2003 | Reedy et al. | ............ | 257/314 |
| 6,693,830 B1 * | 2/2004 | Hu | ............ | G11C 16/0433 365/185.1 |
| 6,841,447 B1 * | 1/2005 | Logie | ............ | H01L 27/115 257/E21.694 |
| 6,846,714 B1 * | 1/2005 | Mehta | ............ | H01L 27/105 257/E21.694 |
| 6,930,002 B1 * | 8/2005 | Chen | ............ | G11C 16/0416 257/E21.694 |
| 6,952,035 B2 * | 10/2005 | Yoshida | ............ | H01L 27/115 257/314 |
| 7,289,352 B2 * | 10/2007 | Hoefler | ............ | G11C 5/144 365/104 |
| 7,301,194 B1 * | 11/2007 | Paak | ............ | H01L 27/115 257/315 |
| 7,652,917 B2 * | 1/2010 | Oka | ............ | G11C 16/0433 257/316 |

(Continued)

FOREIGN PATENT DOCUMENTS

KR    10-2010-0079306 A    7/2010

*Primary Examiner* — Vu Le
*Assistant Examiner* — Sung Cho

(57) ABSTRACT

A cell array portion of a single-layer gate EEPROM device includes a plurality of unit cells formed over a substrate to share a first well region in the substrate. Each of the plurality of unit cells includes a floating gate having a first part disposed over the first well region and a second part extending from the first part to have a stripe shape, a selection gate spaced apart from the floating gate and disposed to be parallel with the second part of the floating gate, and an active region disposed in the substrate to intersect the floating gate and the selection gate.

7 Claims, 15 Drawing Sheets

(56) References Cited

U.S. PATENT DOCUMENTS

| | | | |
|---|---|---|---|
| 8,592,886 B2* | 11/2013 | Hsu | G11C 16/0433 257/315 |
| 2003/0107921 A1* | 6/2003 | Huang | G11C 16/12 365/185.26 |
| 2003/0137005 A1* | 7/2003 | Mitros | H01L 29/7885 257/315 |
| 2003/0142542 A1* | 7/2003 | Yang | G11C 16/0408 365/185.05 |
| 2003/0235082 A1* | 12/2003 | Hsu | H01L 27/11558 365/185.29 |
| 2004/0071011 A1* | 4/2004 | Nishizaka et al. | 365/154 |
| 2004/0109364 A1* | 6/2004 | Yang | G11C 16/0408 365/200 |
| 2004/0140497 A1* | 7/2004 | Adams | H01L 27/115 257/315 |
| 2005/0047211 A1* | 3/2005 | Rathfelder | H01L 27/115 365/185.24 |
| 2005/0087793 A1* | 4/2005 | Jung | H01L 27/115 257/314 |
| 2005/0162914 A1* | 7/2005 | Jung | G11C 11/5621 365/185.18 |
| 2006/0131554 A1* | 6/2006 | Joung | G11C 13/0004 257/2 |
| 2006/0208306 A1* | 9/2006 | Peng | G11C 16/0416 257/315 |
| 2007/0120175 A1* | 5/2007 | Tanaka | H01L 29/42324 257/315 |
| 2007/0215934 A1* | 9/2007 | Tagaki | H01L 21/28273 257/315 |
| 2008/0225593 A1* | 9/2008 | Mitros | G11C 17/04 365/185.14 |
| 2009/0122614 A1* | 5/2009 | Mitros | G11C 16/0441 365/185.18 |
| 2009/0194806 A1* | 8/2009 | Nam | G11C 16/0433 257/322 |
| 2009/0279360 A1* | 11/2009 | Lee et al. | 365/185.17 |
| 2010/0084700 A1* | 4/2010 | Ko | H01L 21/28273 257/316 |
| 2010/0163958 A1* | 7/2010 | Choi | H01L 29/7883 257/319 |
| 2010/0177569 A1 | 7/2010 | Mitros et al. | |
| 2010/0230613 A1* | 9/2010 | Pieprzyk | B01L 3/502738 250/459.1 |
| 2010/0302854 A1* | 12/2010 | Wu | G11C 11/34 365/185.18 |
| 2011/0199830 A1* | 8/2011 | Lee | G11C 16/0433 365/185.18 |
| 2013/0072775 A1* | 3/2013 | Rogers | A61B 5/0478 600/378 |
| 2013/0168755 A1* | 7/2013 | Kim | G11C 16/0441 257/315 |
| 2015/0021676 A1* | 1/2015 | Chen | H01L 27/0805 257/296 |
| 2015/0138892 A1* | 5/2015 | Kim | G11C 16/0433 365/185.21 |

\* cited by examiner

|  | B/L | CS | CG | SG |
|---|---|---|---|---|
| Program | $+V_{pp3}$ | 0 | $+V_{pp1}$ | $+V_{pp2}$ |
| Erasure | Floated | $+V_{ee2}$ | $-V_{ee1}$ | Floated |
| Read | $+V_{BL}$ | 0 | $+V_{read}$ | $+V_{cc}$ |

FIG.10

|     |      | Program    | Erasure    | Read       |
|-----|------|------------|------------|------------|
| 100 | BL1  | +$V_{pp3}$ | 0          | +$V_{BL}$  |
|     | CS   | 0          | +$V_{ee2}$ | 0          |
|     | ACG1 | +$V_{pp1}$ | -$V_{ee1}$ | +$V_{read}$|
|     | WL1  | +$V_{pp2}$ | 0          | +$V_{cc}$  |
| 200 | BL2  | 0          | 0          | 0          |
|     | CS   | 0          | +$V_{ee2}$ | 0          |
|     | ACG1 | +$V_{pp1}$ | -$V_{ee1}$ | +$V_{read}$|
|     | WL1  | +$V_{pp2}$ | 0          | +$V_{cc}$  |
| 300 | BL1  | +$V_{pp3}$ | 0          | +$V_{BL}$  |
|     | CS   | 0          | +$V_{ee2}$ | 0          |
|     | ACG1 | +$V_{pp1}$ | -$V_{ee1}$ | +$V_{read}$|
|     | WL2  | 0          | 0          | 0          |
| 400 | BL2  | 0          | 0          | 0          |
|     | CS   | 0          | +$V_{ee2}$ | 0          |
|     | ACG1 | +$V_{pp1}$ | -$V_{ee1}$ | +$V_{read}$|
|     | WL2  | 0          | 0          | 0          |

FIG.15

|  | BL1 | CS | ACG1 | WL1 |
|---|---|---|---|---|
| Program | +V | 0 | $+V_{PP1}$ | $+V_{PP2}$ |
| Erasure | Floated | $+V_{ee}$ | 0 | Floated |
| Read | $+V_{BL}$ | 0 | $+V_{read}$ | $+V_{CC}$ |

FIG.17

|  |  | Program | Erasure | Read |
|---|---|---|---|---|
| 1000 | BL1 | +V | 0 | $+V_{BL}$ |
|  | CS | 0 | $+V_{ee}$ | 0 |
|  | ACG1 | $+V_{PP1}$ | 0 | $+V_{read}$ |
|  | WL1 | $+V_{PP2}$ | 0 | $+V_{CC}$ |
| 2000 | BL1 | +V | 0 | $+V_{BL}$ |
|  | CS | 0 | $+V_{ee}$ | 0 |
|  | ACG1 | $+V_{PP1}$ | 0 | $+V_{read}$ |
|  | WL2 | 0 | 0 | 0 |
| 3000 | BL2 | 0 | 0 | 0 |
|  | CS | 0 | $+V_{ee}$ | 0 |
|  | ACG1 | $+V_{PP1}$ | 0 | $+V_{read}$ |
|  | WL1 | $+V_{PP2}$ | 0 | $+V_{CC}$ |
| 4000 | BL2 | 0 | 0 | 0 |
|  | CS | 0 | $+V_{ee}$ | 0 |
|  | ACG1 | $+V_{PP1}$ | 0 | $+V_{read}$ |
|  | WL2 | 0 | 0 | 0 |

SINGLE-LAYER GATE EEPROM CELL, CELL ARRAY INCLUDING THE SAME, AND METHOD OF OPERATING THE CELL ARRAY

CROSS-REFERENCES TO RELATED APPLICATIONS

The present application claims priority under 35 U.S.C. 119(a) to Korean Application Nos. 10-2013-0035446 and 10-2013-0060541, filed on Apr. 1, 2013 and May 28, 2013, respectively, in the Korean intellectual property Office, which are incorporated herein by references in their entirety.

BACKGROUND

Embodiments of the present disclosure relate to a nonvolatile memory device and a method of operating the same and, more particularly, to a single-layer gate electrically erasable programmable read-only memory (EEPROM) cell, a cell array including the same, and a method of operating the cell array.

An EEPROM device is a nonvolatile memory device that retains stored data even when not powered. In an EEPROM device, data is electrically stored in memory cells, and the stored data is electrically erased. Various memory cell structures of the EEPROM device have been proposed to improve performance. A typical memory cell of an EEPROM device employs a stacked gate structure in which a floating gate, an inter-gate dielectric layer, and a control gate are sequentially stacked on a semiconductor substrate.

As electronic systems become smaller with the development of fabrication techniques of semiconductor devices, system-on-chip (SOC) products have been utilized as important devices of high performance digital systems. An SOC product may include a plurality of semiconductor devices executing various functions in a single chip. The SOC product may include at least one logic device and at least one memory device, which are integrated in a single chip. Thus, fabrication technologies of an embedded EEPROM device may be required to embed an EEPROM device in an SOC product.

In order to embed an EEPROM device in an SOC product, the fabrication technologies of the embedded EEPROM device have to be compatible with the fabrication technology of the logic device included in the SOC product. In general, a logic device employs transistors having a single gate structure, while the EEPROM device employs cell transistors having a stacked gate structure (e.g., a double gate structure). Thus, an SOC product including an EEPROM device and a logic device may require a complicated fabrication technology. Accordingly, a single-layer gate EEPROM device employing a single-layer gate cell structure is an attractive candidate for use in an embedded EEPROM device. Complementary metal-oxide-semiconductor (CMOS) circuits of the logic device may be readily implemented using the fabrication technology of the single-layer gate EEPROM device. As a result, the fabrication technology of single-layer gate EEPROM device may be widely used in fabrication of an SOC product including an embedded EEPROM device.

In general, an embedded EEPROM device requires a fast access time. Thus, the embedded EEPROM device may be designed to have a NOR-type cell array configuration rather than a NAND-type cell array configuration. In such a case, there may be some limitations in designing peripheral circuits which are capable of preventing read errors from occurring due to over-erased unit cells in a read mode.

Read errors, which occur due to the over erasure phenomenon, may be resolved by modifying methods of operating the unit cells or methods of arranging the unit cells in the embedded EEPROM device. Further, a high performance embedded EEPROM device may be fabricated by preventing non-selected unit cells from being affected or disturbed by voltages applied to a selected unit cell during a program mode or a read mode. Moreover, in order to fabricate a high performance embedded EEPROM device, the embedded EEPROM device may be designed to operate at a low program voltage and a low erasure voltage. This is for scaling down MOS transistors of the embedded EEPROM device to increase a degree of integration of the embedded EEPROM device.

SUMMARY

Various embodiments are directed to a cell array of a single-layer gate EEPROM device and a method of operating the same.

According to some embodiments, a basic cell array portion of a single-layered gate EEPROM device includes a substrate and a plurality of unit cells formed on the substrate to share a first well region in the substrate with each other. Each of the plurality of unit cells includes a floating gate including a first part disposed on the first well region and a second part extending from the first part in a first direction to have a stripe shape, a selection gate spaced apart from the floating gate and disposed to be parallel with the second part of the floating gate, and an active region disposed in the substrate to be parallel with a second direction substantially perpendicular to the first direction and to intersect the floating gate and the selection gate. The active region has a first impurity region adjacent to a sidewall of the floating gate opposite to the selection gate, a second impurity region adjacent to a sidewall of the selection gate opposite to the floating gate, and a third impurity region between the selection gate and the floating gate.

According to further embodiments, a basic cell array portion of a single-layered gate EEPROM device includes a substrate and first, second, third and fourth unit cells formed on the substrate to share a first well region in the substrate with each other. Each of the first, second, third and fourth unit cells includes a floating gate including a first part disposed on the first well region and a second part extending from the first part in a first direction to have a stripe shape, a selection gate spaced apart from the floating gate and disposed to be parallel with the second part of the floating gate, and an active region disposed in the substrate to be parallel with a second direction substantially perpendicular to the first direction and to intersect the floating gate and the selection gate. The active region has a first impurity region adjacent to a sidewall of the floating gate opposite to the selection gate, a second impurity region adjacent to a sidewall of the selection gate opposite to the floating gate, and a third impurity region between the selection gate and the floating gate. The first and second unit cells are symmetric with respect to a straight line disposed therebetween to be parallel with the second direction, the first and third unit cells are symmetric with respect to a straight line disposed therebetween to be parallel with the first direction, and the first and fourth unit cells are point symmetric with respect to a point located therebetween.

According to further embodiments, a cell array portion of a single-layered gate EEPROM device includes a plurality of unit cells arrayed on a substrate along rows and columns. Each of the unit cells includes a selection transistor and a cell transistor serially connected to each other and includes a drain terminal, a selection gate, a floating gate, a control gate electrode and a source terminal. A plurality of bit lines is connected to the plurality of unit cells. Each of the bit lines is electrically connected to the drain terminals of the unit cells arrayed in one of the columns. A plurality of word lines are connected to the plurality of unit cells. Each of the word lines is electrically connected to the selection gates of the unit cells arrayed in one of the rows. A plurality of control gate lines is connected to the plurality of unit cells. Each of the control gate lines is electrically connected to the control gate electrodes of the unit cells arrayed in two adjacent ones of the rows. A common source line is connected to the source terminals of the plurality of unit cells.

According to further embodiments, a method of operating a cell array portion of a single-layered gate EEPROM device is provided. The cell array portion includes a plurality of unit cells arrayed on a substrate along rows and columns, a plurality of bit lines connected to the plurality of unit cells, a plurality of word lines connected to the plurality of unit cells, a plurality of control gate lines connected to the plurality of unit cells, and a common source line connected to the plurality of unit cells. The method of operating the cell array portion of the single-layered gate EEPROM device includes erasing the plurality of unit cells by applying a positive erasure voltage to the common source line and by applying a negative erasure voltage to the plurality of control gate lines.

According to further embodiments, a basic cell array portion of a single-layered gate EEPROM device includes a substrate in which a single well region is disposed, a plurality of unit cells disposed on the single well region, and a contact region disposed in the single well region such that the plurality of unit cells share with each other. Each of the plurality of unit cells includes a floating gate including a first part disposed on the single well region to overlap with a portion of the contact region and a second part extending from the first part to overlap with a portion of the single well region, a selection gate disposed on the single well region to be spaced apart from the second part of the floating gate, and an active region disposed in the single well region to intersect the selection gate and the second part of the floating gate. The active region has a first impurity region adjacent to a sidewall of the floating gate opposite to the selection gate, a second impurity region adjacent to a sidewall of the selection gate opposite to the floating gate, and a third impurity region between the selection gate and the floating gate.

According to further embodiments, a method of operating a cell array portion of a single-layered gate EEPROM device is provided. The cell array portion includes a plurality of unit cells arrayed on a substrate along rows and columns, a plurality of bit lines connected to the plurality of unit cells, a plurality of word lines connected to the plurality of unit cells, a plurality of control gate lines connected to the plurality of unit cells, and a common source line connected to the plurality of unit cells. The method of operating the cell array portion of the single-layered gate EEPROM device includes erasing the plurality of unit cells by applying a positive erasure voltage to the common source line and by applying a ground voltage to the plurality of control gate lines.

BRIEF DESCRIPTION OF THE DRAWINGS

Embodiments of the present invention will become more apparent in view of the attached drawings and accompanying detailed description, in which:

FIG. 10 is a table illustrating an operation of the cell array shown in FIG. 9 according to an embodiment;

FIG. 15 is a table illustrating an operation of the basic cell array portion shown in FIG. 14 according to an embodiment;

FIG. 17 is a table illustrating an operation of the cell array shown in FIG. 16 according to an embodiment.

DETAILED DESCRIPTION OF THE EMBODIMENTS

Hereinafter, embodiments of the present disclosure will be described in detail with reference to the accompanying drawings.

Figure 1:
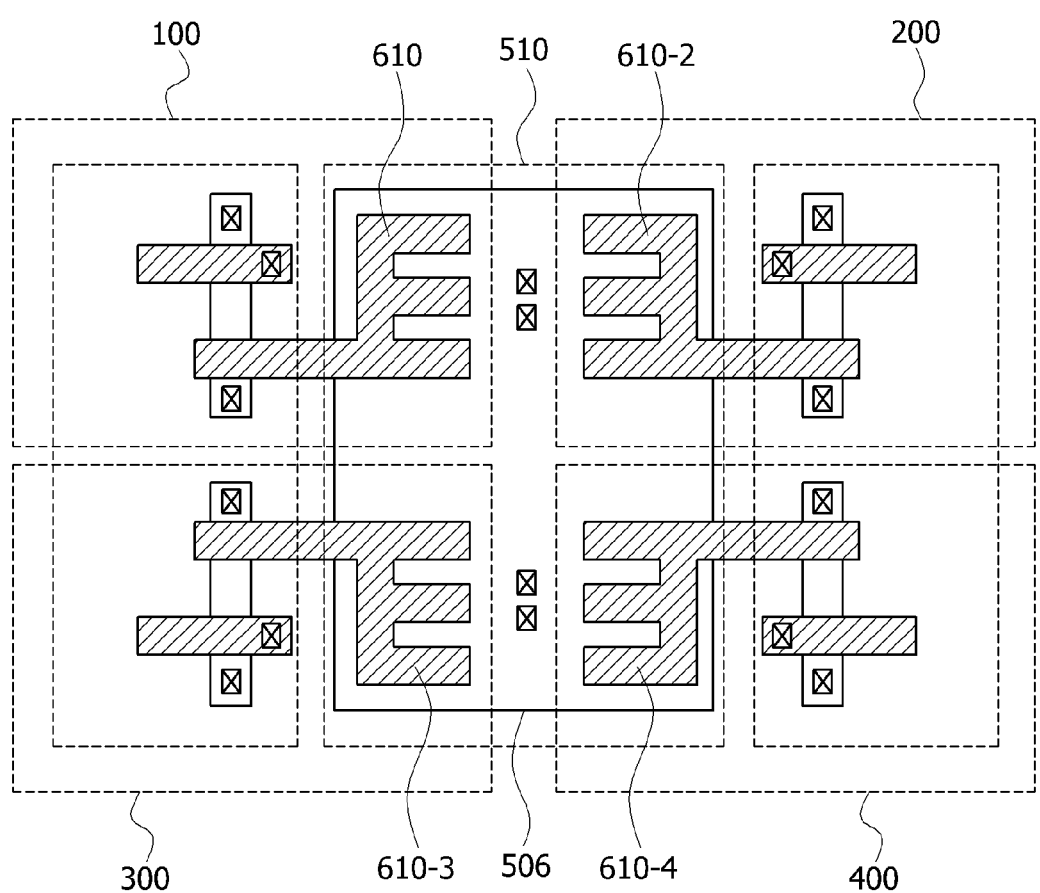
FIG. 1 is a layout diagram illustrating a basic cell array portion of a single-layer gate EEPROM device according to an embodiment.

FIG. 1 is a layout diagram illustrating a basic cell array portion 10 of a single-layer gate EEPROM device according to an embodiment. The basic cell array portion 10 includes a first unit cell 100, a second unit cell 200, a third unit cell 300, and a fourth unit cell 400. The first, second, third, and fourth unit cells 100, 200, 300, and 400 are disposed at an upper-left corner, an upper-right corner, a lower-left corner, and a lower-right corner, respectively. Although the basic cell array portion 10 is configured to include four unit cells arrayed in a 2×2 matrix, the present invention is not limited thereto. In another embodiment, the basic cell array portion 10 is configured to include a plurality of unit cells arrayed in a 2×n matrix, n denoting a natural number equal to or greater than 3. The first, second, third, and fourth unit cells 100, 200, 300 and 400 share a first well region 510. In an embodiment, the first well region 510 is an N-type well region.

The first, second, third, and fourth unit cells 100, 200, 300, and 400 include floating gates 610, 610-2, 610-3, and 610-4, respectively. A portion of the floating gate 610 of the first unit cell 100 overlaps with an upper-left portion of the first well region 510, and a portion of the floating gate 610-2 of the second unit cell 200 overlaps with an upper-right portion of the first well region 510. Further, a portion of the floating gate 610-3 of the third unit cell 300 overlaps with a lower-left portion of the first well region 510, and a portion of the floating gate 610-4 of the fourth unit cell 400 overlaps with a lower-right portion of the first well region 510. That is, the portions of the floating gates 610, 610-2, 610-3, and 610-4 overlap with corresponding portions of the first well region 510, respectively.

In a plan view of FIG. 1, the first and second unit cells 100 and 200 are disposed to be line symmetric with respect to a vertical straight line therebetween. The first and third unit cells 100 and 300 are disposed to be line symmetric with respect to a horizontal straight line therebetween. The first and fourth unit cells 100 and 400 are disposed to be point symmetric with respect to a central point of the basic cell array portion 10. That is, the fourth unit cell 400 is obtained by turning the first unit cell 100 by 180°. Thus, the second and fourth unit cells 200 and 400 are line symmetric with respect to a horizontal straight line therebetween, and the third and fourth unit cells 300 and 400 are line symmetric with respect to a vertical straight line therebetween. As a result, the first, second, third, and fourth unit cells 100, 200, 300, and 400 may have substantially the same structure. Accordingly, hereinafter, only a structure of the first unit cell 100 will be described, and descriptions of the structures of the second to fourth unit cells 200, 300, and 400 will be omitted for the simplicity of explanation.

Figure 2:
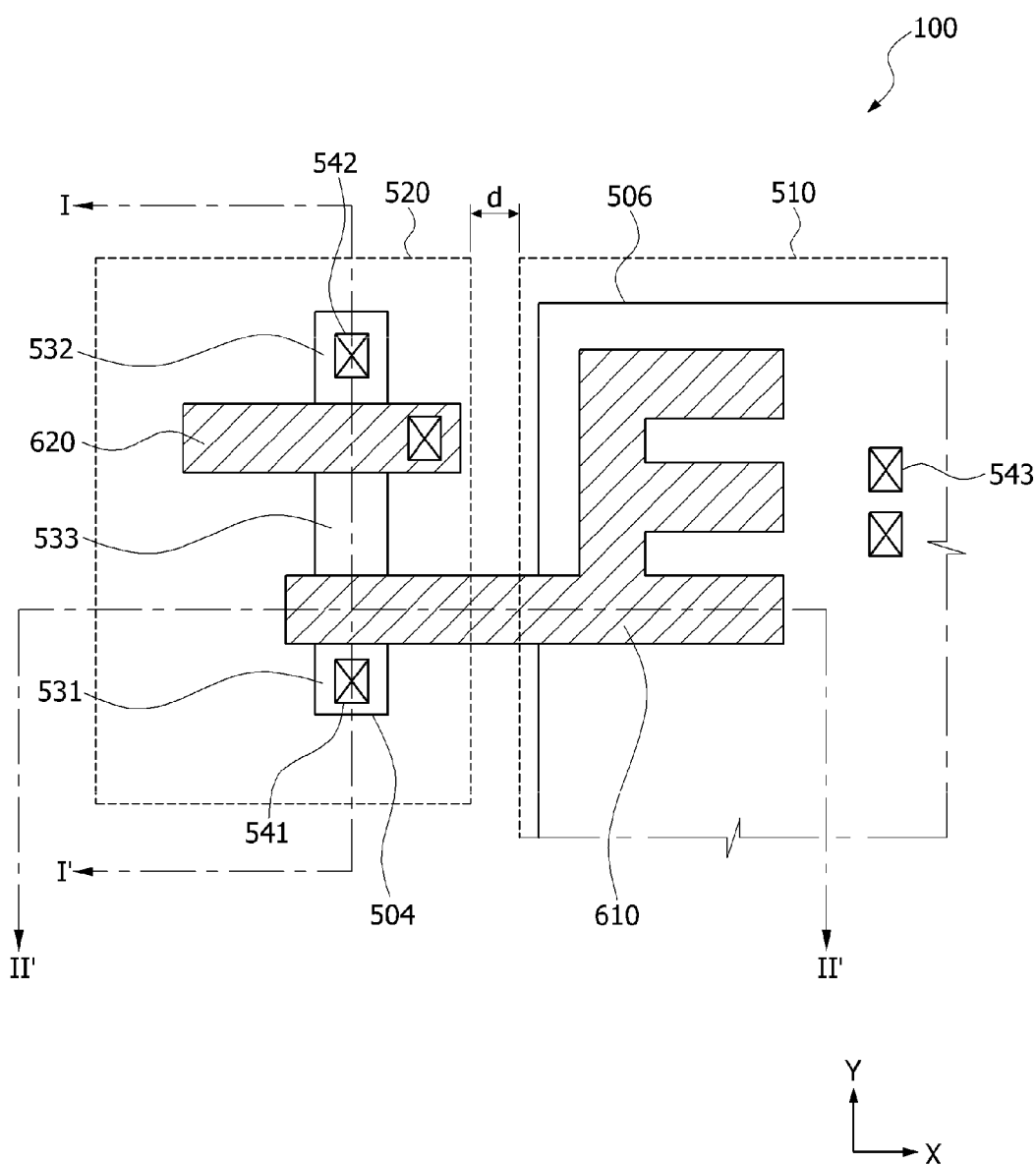
FIG. 2 is a layout diagram illustrating a first unit cell of FIG. 1.
Figure 3:
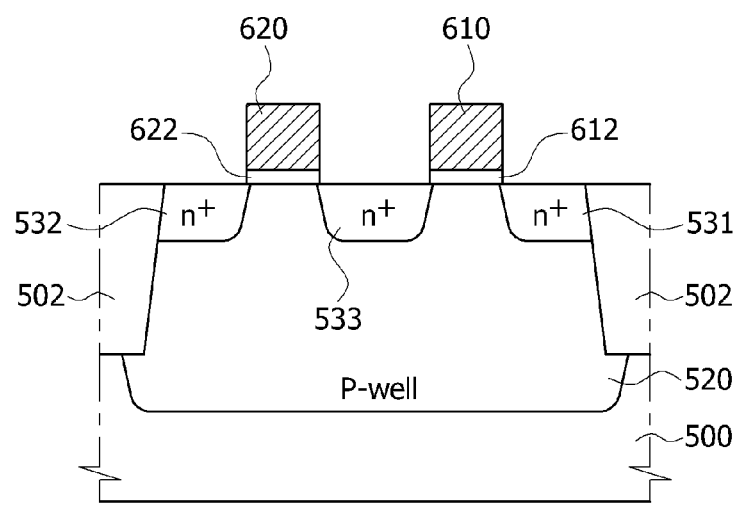
FIG. 3 is a cross-sectional view taken along a line I-I' of FIG. 2 according to an embodiment.
Figure 4:
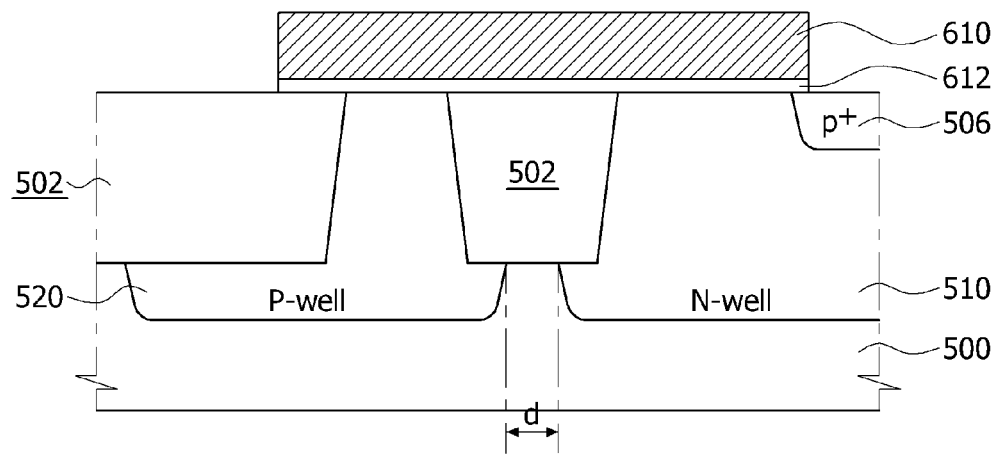
FIG. 4 is a cross-sectional view taken along a line II-II' of FIG. 2 according to an embodiment.

FIG. 2 is a layout diagram illustrating the first unit cell 100 of FIG. 1. FIG. 3 is a cross-sectional view of the first unit cell 100 taken along a line I-I' of FIG. 2 according to an embodiment. FIG. 4 is a cross-sectional view of the first unit cell 100 taken along a line II-II' of FIG. 2 according to an embodiment.

Referring to FIGS. 2, 3, and 4, the first unit cell 100 includes the first well region 510 and a second well region 520 in a substrate 500. The second well region 520 is spaced apart from the first well region 510 by a distance d in a first direction, for example, an X-axis direction. The second well region 520 may have an opposite conductivity type to that of the first well region 510. In an embodiment, the first well region 510 has an N-type conductivity, and the second well region 520 has a P-type conductivity. In an embodiment, the substrate 500 includes a P-type substrate.

A contact region 506 is disposed on the first well region 510. The contact region 506 has an opposite conductivity type to that of the first well region 510. In an embodiment, when the first well region 510 has an N-type conductivity, the contact region 506 is heavily doped with P-type impurities.

An active region 504 is disposed in the second well region 520. The active region 504 includes a first impurity region 531, a second impurity region 532, and a third impurity region 533. The third impurity region 533 is disposed between the first and second impurity regions 531 and 532. The first, second, and third impurity regions 531, 532, and 533 have an opposite conductivity type to that of the second well region 520. In an embodiment, when the second well region 520 has a P-type conductivity, the first, second, and third impurity regions 531, 532, and 533 have an N-type conductivity.

In an embodiment, the first impurity region 531 corresponds to a source region of the first unit cell 100, and the second impurity region 532 corresponds to a drain region of the first unit cell 100. The active region 504 is disposed to extend in a second direction that is perpendicular to the first direction. That is, the active region 504 extends in a Y-axis direction. The active region 504 and the contact region 506 are defined by an isolation layer 502. In an embodiment, the isolation layer 502 includes a trench isolation layer.

A first insulation layer 612 is disposed over the first well region 510 and the second well region 520, and the floating gate 610 is disposed on the first insulation layer 612. The floating gate 610 partially overlaps with the contact region 506 at its edges.

The contact region 506 may be formed by implanting impurity ions into the first well region 510 using the floating gate 610 as an ion implantation mask. Therefore, the contact region 506 may slightly overlap with the edges of the floating gate 610 as shown in FIG. 4. As a result, if a negative erasure voltage is applied to the contact region 506 acting as a control gate and a positive erasure voltage is applied to the first impurity region 531 acting as a common source region in order to erase data stored in the first unit cell 100, a coupling voltage may be induced at the floating gate 610.

In such a case, the coupling voltage induced at the floating gate 610 may be determined by a coupling ratio of the first unit cell 100. That is, when the first well region 510 has an N-type and the contact region 506 has a P-type, the coupling ratio in an erasure mode may be proportional to the perimeter capacitance between the floating gate 610 and the contact region 506. Accordingly, as illustrated in FIG. 2, the floating gate 610 over the first well region 510 is formed to have a comb-shaped configuration or a finger-shaped configuration to increase a perimeter of the floating gate 610, which directly affects the coupling ratio in the erasure mode. The floating gate 610 may include a polysilicon layer.

The floating gate 610 and the first insulation layer 612 intersect the isolation layer 502 between the first well region 510 and the second well region 520, and extend in the first direction, i.e., the X-axis direction, to overlap with the second well region 520. That is, the floating gate 610 and the first insulation layer 612 on the second well region 520 are disposed to have a stripe shape extending along the X-axis direction. The floating gate 610 and the first insulation layer 612 extending over the second well region 520 intersect the active region 504. Thus, the floating gate 610 and the first insulation layer 612 overlap with a portion of the active region 504, as illustrated in FIG. 2.

A second insulation layer 622 is disposed on the second well region 520, and a selection gate 620 is disposed on the second insulation layer 622. In an embodiment, the selection gate 620 includes the same material layer as that of the floating gate 610. In an embodiment, the floating gate 610 and the selection gate 620 include a polysilicon layer. The selection gate 620 and the second insulation layer 622 are disposed on the second well region 520 to have a stripe shape extending in the X-axis direction.

The selection gate 620 is disposed to be spaced apart from and parallel with the floating gate 610 on the second well region 520. The selection gate 620 and the second insulation layer 622 intersect the active region 504. That is, the selection gate 620 and the second insulation layer 622 overlap with a portion of the active region 504 as shown in FIG. 2.

The floating gate 610 and the selection gate 620 on the second well region 520 divide the active region 504 into three regions. That is, the first impurity region 531 of the active region 504 is disposed at one side of the floating gate 610, and the second impurity region 532 of the active region 504 is disposed at one side of the selection gate 620. The third impurity region 533 of the active region 504 is disposed at the respective other sides of the selection gate 620 and the floating gate 610, i.e., between the selection gate 620 and the floating gate 610 intersecting the active region 504.

A first contact 541 is disposed on the first impurity region 531, and a second contact 542 is disposed on the second impurity region 532. Further, a third contact 543 is disposed on the contact region 506. The first contact 541 may be electrically connected to a first electrode (not shown), and the second contact 542 may be electrically connected to a second electrode (not shown). The third contact 543 may be electrically connected to a third electrode (not shown).

Figures 5, 6:
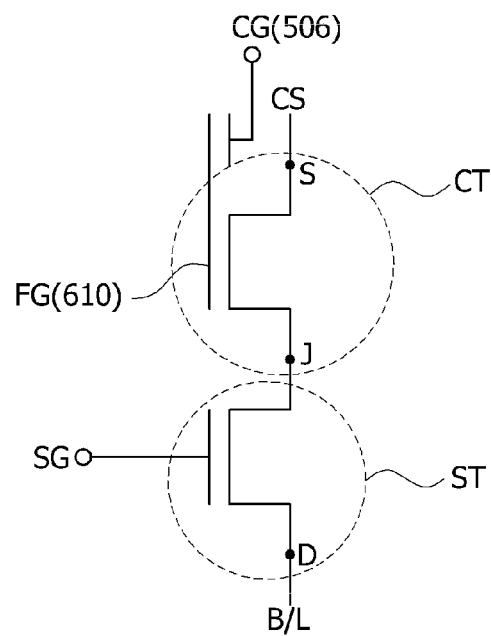
FIG. 5 is an equivalent circuit of the first unit cell shown in FIG. 2.
FIG. 6 is a table illustrating an operation of the first unit cell shown in FIG. 2 according to an embodiment.

FIG. 5 illustrates an equivalent circuit of the first unit cell 100 shown in FIG. 2 according to an embodiment of the present invention. Referring to FIGS. 2 and 5, the first unit cell 100 is expressed by an equivalent circuit including a cell transistor CT and a selection transistor ST which are serially connected to each other.

The cell transistor CT may include the floating gate 610, the first impurity region 531, and the third impurity region 533. The selection transistor ST may include the selection gate 620, the second impurity region 532, and the third impurity region 533. The cell transistor CT may share the third impurity region 533 with the selection transistor ST.

In FIG. 5, the cell transistor CT includes a floating gate terminal FG, a source terminal S, and a connection terminal J. The floating gate terminal FG may correspond to the floating gate 610 of FIG. 2. The floating gate terminal FG may be capacitively coupled to a control gate electrode CG corresponding to the contact region 506 of FIG. 2. The source terminal S may correspond to the first impurity region 531 of FIG. 2. The source terminal S is electrically connected to a common source line CS. The connection terminal 3, which is shared by the cell transistor CT and the selection transistor ST, may correspond to the third impurity region 533 of FIG. 2.

The selection transistor ST includes a selection gate terminal SG, a drain terminal D, and the connection terminal J. The selection gate terminal SG may correspond to the selection gate 620 of FIG. 2. A selection gate voltage may be applied to the selection gate terminal SG. The drain terminal D may correspond to the second impurity region 532 of FIG. 2. The drain terminal D is electrically connected to a bit line B/L.

FIG. 6 is a table illustrating an operation of the first unit cell 100 shown in FIG. 2 according to an embodiment. The operation will be described with reference to FIGS. 2, 3, 5, and 6.

A program operation of the first unit cell 100 may be achieved by a hot carrier injection mechanism. In more detail, first, second, and third positive program voltages $+V_{pp1}$, $+V_{pp2}$, and $+V_{pp3}$ may be respectively applied to the control gate electrode CG, the selection gate terminal SG, and the bit line B/L in order to program the first unit cell 100 using the hot carrier injection mechanism. During the program operation, the common source line CS and the substrate 500 such as a P-type substrate may be grounded. Further, the first well region 510, that is, the N-type well region may be floated.

As described above, the first unit cell 100 has a structure that can be programmed using the hot carrier injection mechanism. Thus, a maximum program voltage, e.g., the first positive program voltage $+V_{pp1}$, used in the program operation of the first unit cell 100 with the hot carrier injection mechanism may be lower than that used in a program operation using a Fowler-Nordheim (FN) tunneling mechanism by about 2V to 5V. As a result, the power consumption of an EEPROM device including the first unit cell 100 may be reduced. This may lead to reduction in the size or number of logic elements, such as high voltage transistors, which are used to drive the first positive program voltage $+V_{pp1}$.

Under the bias condition described above in the program operation, a positive voltage may be induced at the floating gate FG (610) by a coupling ratio that is proportional to perimeter capacitance between the floating gate FG (610) and the control gate CG (i.e., the contact region 506). Further, the selection transistor ST may be turned on by the second positive program voltage $+V_{pp2}$ applied to the selection gate SG (620), and thus the third positive program voltage $+V_{pp3}$ applied to the bit line B/L (e.g., the second impurity region 532) may be transmitted to the connection terminal 3 (e.g., the third impurity region 533). The positive voltage induced at the floating gate 610 and the third positive program voltage $+V_{pp3}$ transmitted to the connection terminal 3 (i.e., the third impurity region 533) may generate a strong electric field under the floating gate 610, and thus hot electrons may be generated and injected into the floating gate 610 by the strong electric field generated under the floating gate 610. As a result, a threshold voltage of the cell transistor CT may be positively increased to program the first unit cell 100.

An erasure operation of the first unit cell 100 may be achieved by a band-to-band tunneling (BTBT) mechanism. Specifically, the first unit cell 100 may be erased by applying a negative erasure voltage $-V_{ee1}$ to the control gate electrode CG and a positive erasure voltage $+V_{ee2}$ to the common source line CS. During the erasure operation, the selection gate SG (620), the bit line B/L, and the first well region 510 (i.e., the N-type well region) may be floated, and the substrate 500, for example, a P-type substrate may be grounded. As described above, the first unit cell 100 has a structure that can be erased using the band-to-band tunneling mechanism. Thus, an absolute value of the negative erasure voltage $-V_{ee1}$ applied to the control gate electrode CG that is used in the erasure operation of the first unit cell 100 with the band-to-band tunneling mechanism may be smaller than that used in an erasure operation using the Fowler-Nordheim (FN) tunneling mechanism by about 8V to 12V. As a result, the power consumption of an EEPROM device including the first unit cell 100 may be reduced. This may lead to reduction in the size or number of logic elements, such as high voltage transistors, which are used to drive the negative erasure voltage $-V_{ee1}$.

Under the bias condition described above in the erasure operation, a predetermined voltage may be induced at the floating gate FG (610) by a coupling ratio that is proportional to the perimeter capacitance between the floating gate FG (610) and the control gate CG (i.e., the contact region 506), and hot holes may be injected into the floating gate FG by a band-to-band tunneling current (corresponding to a gate induced drain leakage (GIDL) current) that flows through a junction between the first impurity region 531 connected to the common source line CS and the second well region 520 connected to a ground terminal. The hot hoes injected into the floating gate FG may be recombined with electrons in the floating gate FG to lower a threshold voltage of the cell transistor CT. As a result, data stored in the first unit cell 100 may be erased.

To achieve a read operation of the first unit cell 100, a positive bit line voltage $+V_{BL}$ may be applied to the bit line B/L and a positive selection gate voltage $+V_{CC}$ may be applied to the selection gate SG (620). Further, a positive read voltage $+V_{read}$ may be applied to the control gate electrode CG (506), and the second well region 520 and the common source line CS may be grounded. The positive read voltage $+V_{read}$ may be set to have a voltage level between a threshold voltage of the erased unit cell 100 and a threshold voltage of the programmed unit cell 100.

Under the bias condition described above in the read operation, the selection transistor ST may be turned on by the positive selection gate voltage $+V_{CC}$ applied to the selection gate SG (620). Accordingly, the positive bit line voltage $+V_{BL}$ may be transmitted to the third impurity region 533 through the second impurity region 532. The cell transistor CT may be turned on or turned off according to a threshold voltage thereof when the positive read voltage $+V_{read}$ is applied to the control gate electrode CG (506). If the cell transistor CT is programmed to have a threshold voltage higher than the positive read voltage $+V_{read}$, the cell transistor CT may be turned off even though the positive read voltage $+V_{read}$ is applied to the control gate electrode CG (506). In contrast, if the cell transistor CT is erased to have a threshold voltage lower than the positive read voltage $+V_{read}$, the cell transistor CT may be turned on when the positive read voltage $+V_{read}$ is applied to the control gate electrode CG (506). Accordingly, a sense amplifier (not shown) connected to the bit line B/L can determine whether the first unit cell 100 is programmed or erased by detecting a cell current that flows through the bit line B/L.

Figure 7:
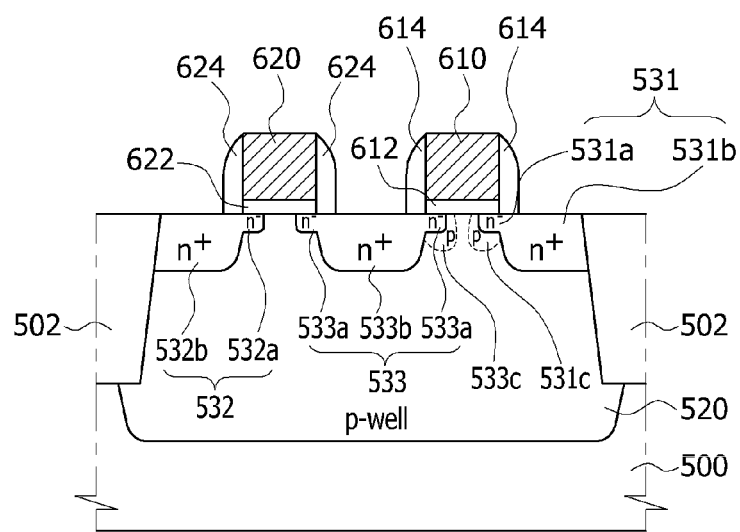
FIG. 7 is a cross-sectional view taken along the line I-I' of FIG. 2 according to another embodiment.

FIG. 7 is a cross-sectional view of the first unit cell 100 taken along the line I-I' of FIG. 2 according to another embodiment. In FIGS. 3 and 7, the same reference numerals denote the same elements. Thus, descriptions of the same elements as illustrated in FIG. 3 may be omitted or briefly mentioned for the simplicity of explanation.

Referring to FIG. 7, the first unit cell 100 may be integrated on a substrate 500 together with logic circuits using the same process. In general, impurity regions of transistors constituting the logic circuits may have a lightly-doped drain (LDD) structure. Thus, first to third impurity regions 531, 532, and 533, which are simultaneously formed with the impurity regions of the transistors of the logic circuits, may also have the LDD structure.

In FIG. 7, the first impurity region 531 includes a first extended impurity region 531*a* and a first deep impurity region 531*b*, and the second impurity region 532 includes a second extended impurity region 532*a* and a second deep impurity region 532*b*. Similarly, the third impurity region 533 includes a third extended impurity region 533*a* and a third deep impurity region 533*b*. Herein, the third extended impurity region 533*a* is formed under both of a floating gate 610 and a selection gate 620. To form the first to third impurity regions 531, 532, and 533 having the LDD structure, first gate spacers 614 are formed on sidewalls of the floating gate 610, and second gate spacers 624 are formed on sidewalls of the selection gate 620.

A first halo region 531*c* and a second halo region 533*c* are disposed under both edges of the floating gate 610 and surround a sidewall of the first extended impurity region 531*a* and a sidewall of the third extended impurity region 533*a* under the floating gate 610, respectively. Although not shown in the drawings, during formation of the first and second halo regions 531*c* and 533*c*, other halo regions may be formed under both edges of the selection gate 620 to surround a sidewall of the second extended impurity region 532*a* and a sidewall of the third extended impurity region 533*a* under the selection gate 620, respectively.

The third extended impurity region 533*a* under the floating gate 610 may suppress generation of hot electrons. The second halo region 533*c* surrounding the third extended impurity region 533*a* under the floating gate 610 may increase an electric field generated between the third impurity region 533 and the second well region 520 under the floating gate 610 during a program operation. This is because the halo regions 531*c* and 533*c* have the same conductivity type as that of the second well region 520 and the impurity concentration of the halo regions 531*c* and 533*c* is higher than that of the second well region 520. Accordingly, a generation rate of electron-hole pairs in the vicinity of the third impurity region 533 may be increased due to the presence of the second halo region 533*c*. As a result, a program efficiency of the first unit cell of FIG. 7 is improved.

Figure 8:
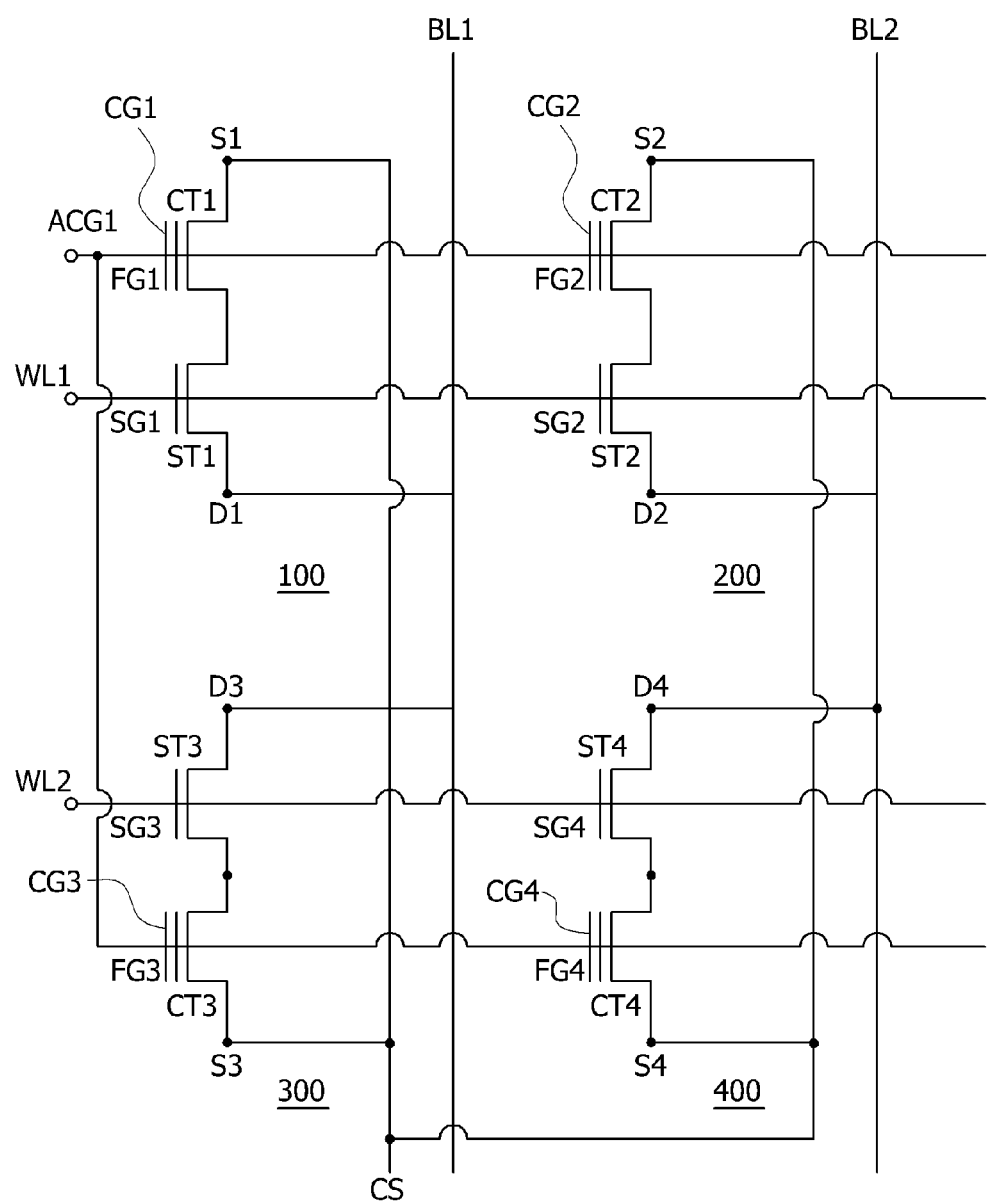
FIG. 8 is an equivalent circuit of the basic cell array portion shown in FIG. 1.

FIG. 8 illustrates an equivalent circuit of the basic cell array portion 10 shown in FIG. 1. The basic cell array portion 10 includes the first unit cell 100, the second unit cell 200, the third cell unit 300, and the fourth unit cell 400, which are arrayed in a matrix form.

The first unit cell 100 includes a first cell transistor CT1 and a first selection transistor ST1, which are serially connected to each other, as described with reference to FIG. 5. The first cell transistor CT1 includes a first control gate electrode CG1, a first floating gate FG1, and a first source terminal S1. The first selection transistor ST1 includes a first selection gate SG1 and a first drain terminal D1.

The second unit cell 200 includes a second cell transistor CT2 and a second selection transistor ST2, which are serially connected to each other. The second cell transistor CT2 includes a second control gate electrode CG2, a second floating gate FG2, and a second source terminal S2. The second selection transistor ST2 includes a second selection gate SG2 and a second drain terminal D2.

The third unit cell 300 includes a third cell transistor CT3 and a third selection transistor ST3, which are serially connected to each other. The third cell transistor CT3 includes a third control gate electrode CG3, a third floating gate FG3, and a third source terminal S3. The third selection transistor ST3 includes a third selection gate SG3 and a third drain terminal D3.

The fourth unit cell 400 includes a fourth cell transistor CT4 and a fourth selection transistor ST4, which are serially connected to each other. The fourth cell transistor CT4 includes a fourth control gate electrode CG4, a fourth floating gate FG4, and a fourth source terminal S4. The fourth selection transistor ST4 includes a fourth selection gate SG4 and a fourth drain terminal D4.

As described with reference to FIG. 1, a portion of the floating gate 610 of the first unit cell 100, a portion of the floating gate 610-2 of the second unit cell 200, a portion of the floating gate 610-3 of the third unit cell 300, and a portion of the floating gate 610-4 of the fourth unit cell 400 overlap with corresponding portions of the first well region 510, respectively. Thus, the first floating gate FG1 of the first cell transistor CT1, the second floating gate FG2 of the second cell transistor CT2, the third floating gate FG3 of the third cell transistor CT3, and the fourth floating gate FG4 of the fourth cell transistor CT4 are capacitively coupled to the contact region 506 in the first well region 510. The contact region 506 may act as the first to fourth control gate electrodes CG1, CG2, CG3, and CG4, and the first to fourth control gate electrodes CG1, CG2, CG3, and CG4 are commonly connected to a first control gate line ACG1.

The first selection gate SG1 of the first selection transistor ST1 and the second selection gate SG2 of the second selection transistor ST2 are electrically connected to a first word line WL1, and the third selection gate SG3 of the third selection transistor ST3 and the fourth selection gate SG4 of the fourth selection transistor ST4 are electrically connected to a second word line WL2.

The first source terminal S1 of the first unit cell 100, the second source terminal S2 of the second unit cell 200, the third source terminal S3 of the third unit cell 300, and the fourth source terminal S4 of the fourth unit cell 400 are connected to a common source line CS. The first drain terminal D1 of the first unit cell 100 and the third drain terminal D3 of the third unit cell 300 are connected to a first bit line BL1, and the second drain terminal D2 of the second unit cell 200 and the fourth drain terminal D4 of the fourth unit cell 400 are connected to a second bit line BL2.

Figure 9:
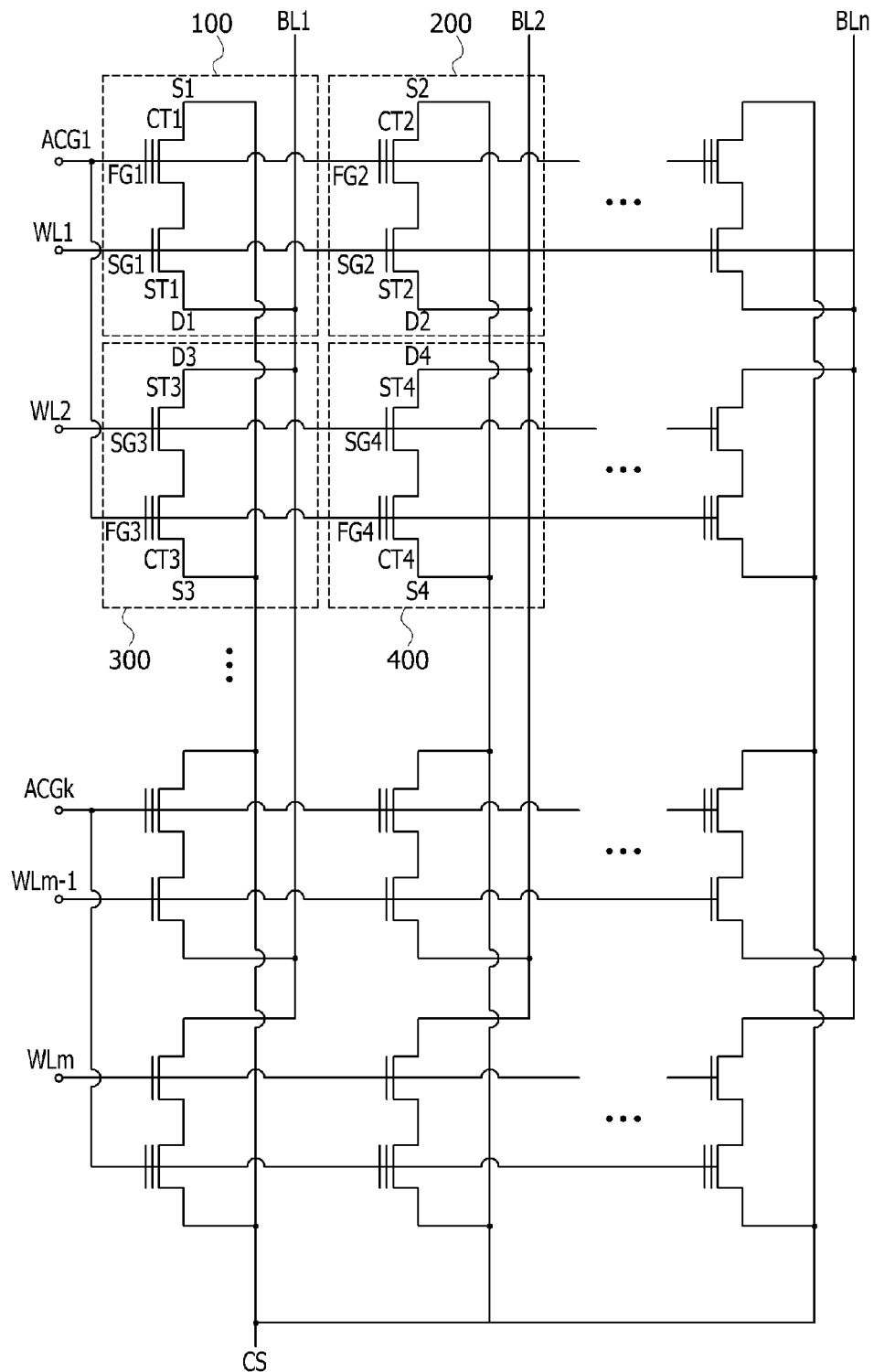
FIG. 9 is an equivalent circuit of a cell array including the basic cell array portion shown in FIG. 8.

FIG. 9 illustrates an equivalent circuit of a cell array including the basic cell array portion shown in FIG. 8. Referring to FIG. 9, the basic cell array portion shown in FIG. 8 is two-dimensionally arrayed in a (n/2)×(m/2) matrix to constitute a cell array of a single layered gate EEPROM device according to an embodiment. That is, the basic cell array portion shown in FIG. 8 is repeatedly arrayed n/2 times in a row direction, and a plurality of basic cell array portions arranged in the row direction is repeatedly arrayed m/2 times in a column direction. The first control gate line ACG1 are connected to the control gate electrodes CG1, CG2, CG3, and CG4 of each of (n/2) number of basic cell array portions in a first row. Similarly, a K$^{th}$ control gate line ACGk is connected to the control gate electrodes CG1, CG2, CG3, and CG4 of each of (n/2) number of basic cell array portions in a (m/2)$^{th}$ row.

A first word line WL1 is electrically connected to the first selection gate SG1 of the first selection transistor ST1 and the second selection gate SG2 of the second selection transistor ST2 of each of the (n/2) number of basic cell array portions that are arrayed in the first row. A second word line WL2 is electrically connected to the third selection gate SG3 of the third selection transistor ST3 and the fourth selection gate SG4 of the fourth selection transistor ST4 of each of the (n/2) number of basic cell array portions that are arrayed in the first row. In the same manner, a (m−1)$^{th}$ word line WLm-1 is electrically connected to the first selection gate SG1 of the first selection transistor ST1 and the second selection gate SG2 of the second selection transistor ST2 of each of (n/2) number of basic cell array portions that are arrayed in a (m/2)$^{th}$ row, and an m$^{th}$ word line WLm is electrically connected to the third selection gate SG3 of the third selection transistor ST3 and the fourth selection gate SG4 of the fourth selection transistor ST4 of each of the (n/2) number of basic cell array portions that are arrayed in the (m/2)$^{th}$ row.

A first bit line BL1 is electrically connected to the first drain terminal D1 of the first unit cell 100 and the third drain terminal D3 of the third unit cell 300 of each of (m/2) number of basic cell array portions that are arrayed in a first column. A second bit line BL2 is electrically connected to the second drain terminal D2 of the second unit cell 200 and the fourth drain terminal D4 of the fourth unit cell 400 of each of the (m/2) number of basic cell array portions that are arrayed in the first column. In the same manner, an n$^{th}$ bit line BLn is electrically connected to the second drain terminal D2 of the second unit cell 200 and the fourth drain terminal D4 of the fourth unit cell 400 of each of (m/2) number of basic cell array portions that are arrayed in a (n/2)$^{th}$ column.

The common source line CS is electrically connected to the first to fourth source terminals S1, S2, S3, and S4 of each of (n/2)×(m/2) number of basic cell array portions arrayed in all rows and all columns in the (n/2)×(m/2) matrix.

FIG. 10 is a table illustrating an operation of the cell array shown in FIG. 9. In an embodiment, a single unit cell of a single-layer gate EEPROM device is selectively programmed, and data stored in the single unit cell is selectively read out. On the other hand, all the unit cells in the cell array are simultaneously erased during an erasure operation.

The program operation may be achieved using a hot carrier injection mechanism, and the erasure operation may be achieved using a band-to-band tunneling (BTBT) mechanism causing a hot hole injection phenomenon. Hereinafter, a method of operating a single-layer gate EEPROM device according to an embodiment will be described in conjunction with an illustrative example in which the first unit cell 100 in FIG. 9 is selectively programmed and read out.

Referring to FIGS. 9 and 10, the first unit cell 100 located at an intersection of a first row and a first column is selectively programmed by applying a first positive program voltage +V$_{PP1}$ to the first control gate line ACG1, a second positive program voltage +V$_{PP2}$ to the first word line WL1, and a third positive program voltage +V$_{PP3}$ to the first bit line BL1. During the program operation, the common source line CS may be grounded. Under the above bias condition, hot electrons may be injected into the first floating gate of the selected first unit cell 100 to increase a threshold voltage of the selected first unit cell 100. Accordingly, the selected first unit cell 100 is programmed.

During the program operation, the non-selected second unit cell 200 connected to the first word line WL1 and the second bit line BL2 is not programmed because no bias is applied to the second bit line BL2, e.g., a ground voltage is applied to the second bit line BL2. This is so even though the first positive program voltage +V$_{PP1}$ is applied to the first control gate line ACG1 and the second positive program voltage +V$_{PP2}$ is applied to the first word line WL1.

During the program operation, the non-selected fourth unit cell 400 connected to the second bit line BL2 and the second word line WL2 is not programmed because no bias is applied to the second bit line BL2 and the second word line WL2, e.g., a ground voltage is applied to the second bit line BL2 and the second word line WL2. This is so even though the first positive program voltage +V$_{PP1}$ is applied to the first control gate line ACG1 connected to the non-selected fourth unit cell 400.

During the program operation, the non-selected third unit cell 300 connected to the first bit line BL1 and the second word line WL2 is not programmed because no bias is applied to the second word line WL2, e.g., a ground voltage is applied to the second word line WL2. This is so even though the first positive program voltage +V$_{PP1}$ is applied to the first control gate line ACG1 connected to the non-selected third unit cell 300 and the third positive program voltage +V$_{PP3}$ is applied to the first bit line BL1 connected to the non-selected third unit cell 300.

An erasure operation of the single-layer gate EEPROM device according to an embodiment may be achieved by applying a negative erasure voltage −V$_{ee1}$ to all the control gate lines ACG1~ACGk and a positive erasure voltage +V$_{ee2}$ to the common source line CS. Because all the unit cells share the common source line CS and the negative erasure voltage −V$_{ee1}$ is applied to all the control gate lines ACG1~ACGk, all the unit cells including the first to fourth unit cells 100, 200, 300, and 400 are under the same bias condition. Thus, threshold voltages of all the unit cells may be lowered by a BTBT mechanism during the erasure operation. As a result, all the unit cells are erased.

Data stored in the first unit cell 100 located at the intersection of the first row and the first column may be selectively read out by applying a positive bit line voltage +V$_{BL}$ to the first bit line BL1, a positive selection gate voltage +V$_{CC}$ to the first word line WL1, and a positive read voltage +V$_{read}$ to the first control gate line ACG1.

During the read operation, the common source line CS may be grounded. The positive read voltage +V$_{read}$ may be set to have a voltage level between a threshold voltage of the programmed unit cell and a threshold voltage of the erased unit cell. Under the above bias condition, a sense amplifier (not shown) connected to the first bit line BL1 can determine whether the selected first unit cell 100 is programmed or erased by detecting a cell current that flows through the first bit line BL1.

During the read operation, data stored in the non-selected second unit cell 200 connected to the second bit line BL2 and the first word line WL1 is not read out because no bias is applied to the second bit line BL2, e.g., a ground voltage is applied to the second bit line BL2. This is so even though the positive selection gate voltage +V$_{CC}$ is applied to the first word line WL1 and the positive read voltage +V$_{read}$ is applied to the first control gate line ACG1.

During the read operation, data stored in the non-selected third unit cell 300 connected to the first bit line BL1 and the second word line WL2 is not read out because no bias is applied to the second word line WL2, e.g., a ground voltage is applied to the second word line WL2. This is so even though the positive bit line voltage +$V_{BL}$ is applied to the first bit line BL1 and the positive read voltage +$V_{read}$ is applied to the first control gate line ACG1.

During the read operation, data stored in the non-selected fourth unit cell 400 connected to the second bit line BL2 and the second word line WL2 is not read out because no bias is applied to the second bit line BL2 and the second word line WL2, e.g., a ground voltage is applied to the second bit line BL2 and the second word line WL2. This is so even though the positive read voltage +$V_{read}$ is applied to the first control gate line ACG1.

According to the embodiments set forth above, limitations in designing a layout of a cell array may be reduced, and any program disturbances or any read disturbances may be prevented even though an extra inhibition bias generation circuit is not included. Thus, the reliability of the single-layer gate EEPROM device may be improved. In addition, program voltages and erasure voltages may be lowered since the area of a region that a peripheral circuit region occupies is reduced. Moreover, a breakdown voltage characteristic between the first and second well regions may be improved.

Figure 11:
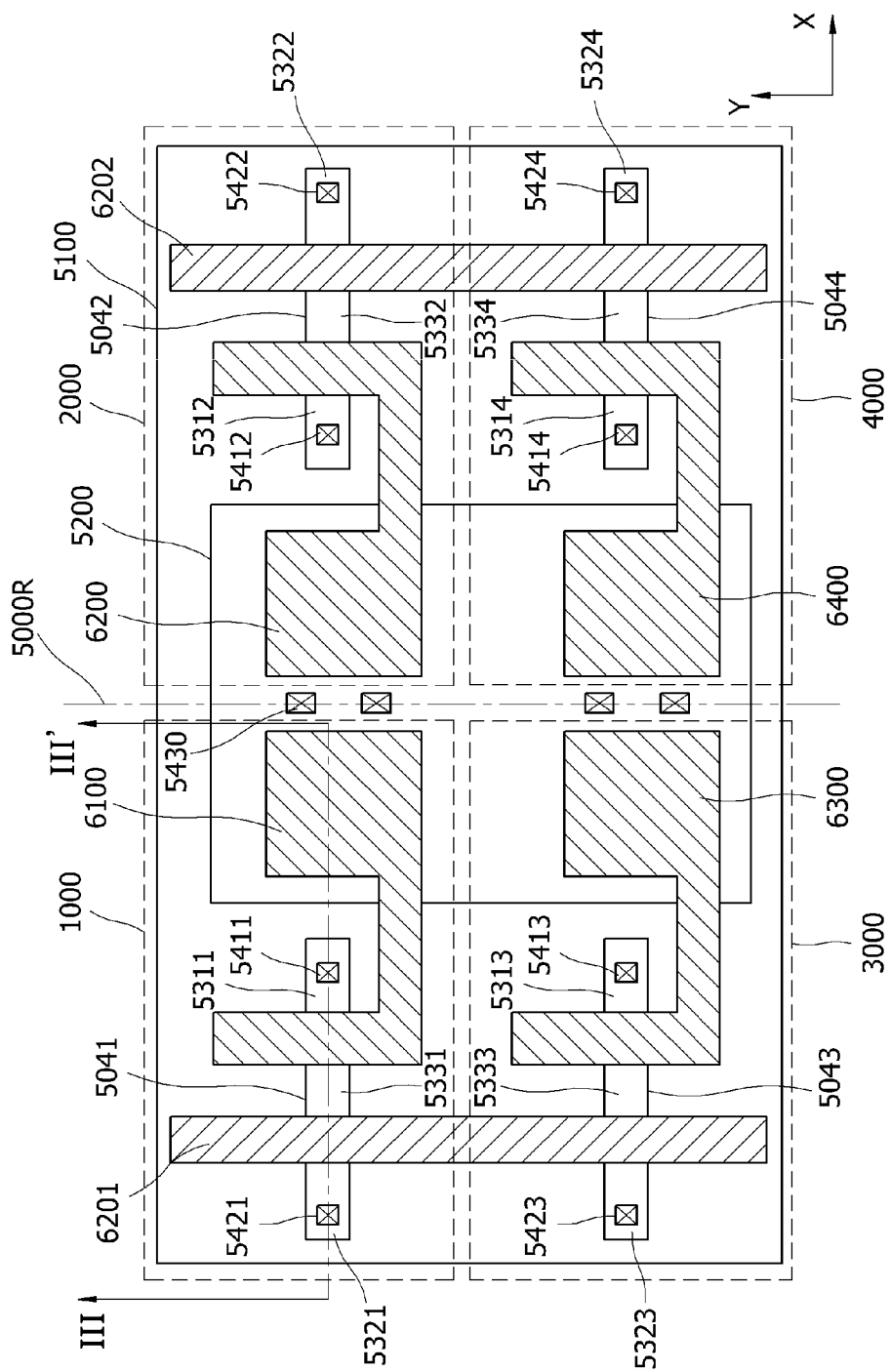
FIG. 11 is a layout diagram illustrating a basic cell array portion of a single-layer gate EEPROM device according to another embodiment.

FIG. 11 illustrates a basic cell array portion of a single-layer gate EEPROM device according to another embodiment. The basic cell array portion includes a first unit cell 1000, a second unit cell 2000, a third unit cell 3000, and a fourth unit cell 4000.

The first and third unit cells 1000 and 3000 are disposed at a left side of a vertical straight line 5000R, which is parallel with a Y-axis, and the second and fourth unit cells 2000 and 4000 are disposed at a right side of the vertical straight line 5000R.

In particular, the first unit cell 1000 is disposed at an upper-left side of the vertical straight line 5000R, and the third unit cell 3000 is disposed at a lower-left side of the vertical straight line 5000R. The second unit cell 2000 is disposed at an upper-right side of the vertical straight line 5000R, and the fourth unit cell 4000 is disposed at a lower-right side of the vertical straight line 5000R. The layouts of the first unit cell 1000 and the second unit cell 2000 may be symmetric to each other across the vertical straight line 5000R, and the layouts of the third unit cell 3000 and the fourth unit cell 4000 may also be symmetric to each other across the vertical straight line 5000R.

Although the basic cell array portion of FIG. 11 is configured to include four unit cells arrayed in a 2×2 matrix, the present invention is not limited thereto. In another embodiment, the basic cell array portion is configured to include a plurality of unit cells arrayed in a 2×n matrix, n denoting a natural number equal to or greater than 3. All of the first, second, third, and fourth unit cells 1000, 2000, 3000, and 4000 are disposed on a single well region 5100. A contact region 5200 is disposed in the well region 5100. In an embodiment, the well region 5100 has a P-type conductivity, and the contact region 5200 has an N-type conductivity.

The first, second, third, and fourth unit cells 1000, 2000, 3000, and 4000 include floating gates 6100, 6200, 6300, and 6400, respectively. A portion of the floating gate 6100 of the first unit cell 1000 may be disposed to overlap with an upper-left portion of the contact region 5200, and a portion of the floating gate 6200 of the second unit cell 2000 may be disposed to overlap with an upper-right portion of the contact region 5200. Further, a portion of the floating gate 6300 of the third unit cell 3000 may be disposed to overlap with a lower-left portion of the contact region 5200, and a portion of the floating gate 6400 of the fourth unit cell 4000 may be disposed to overlap with a lower-right portion of the contact region 5200.

That is, a portion of the floating gate 6100 of the first unit cell 1000, a portion of the floating gate 6200 of the second unit cell 2000, a portion of the floating gate 6300 of the third unit cell 3000, and a portion of the floating gate 6400 of the fourth unit cell 4000 may all overlap with the contact region 5200. In this embodiment, the portion of each floating gate 6100, 6200, 6300 or 6400 disposed over the contact region 5200 is referred to as a first floating part, and the remaining portion of each floating gate 6100, 6200, 6300 or 6400 extending onto the well region 5100 outside the contact region 5200 is referred to as a second floating part.

In an embodiment, the contact region 5200 is formed by implanting N-type impurity ions into the well region 5100 using the floating gates 6100, 6200, 6300 and 6400 as ion implantation masks. Thus, the contact region 5200 may overlap with edges of the floating gates 6100, 6200, 6300, and 6400 disposed over the contact region 5200.

The first, second, third, and fourth unit cells 1000, 2000, 3000, and 4000 include active regions 5041, 5042, 5043, and 5044 disposed to be parallel with an X-axis, respectively. Further, the first and third unit cells 1000 and 3000 share a selection gate 6201 that intersects the active regions 5041 and 5043 and is parallel with the Y-axis, and the second and fourth unit cells 2000 and 4000 share a selection gate 6202 that intersects the active regions 5042 and 5044 and is parallel with the Y-axis.

The active regions 5041, 5042, 5043, and 5044 are disposed over the well region 5100 and apart from the contact region 5200. The second floating part of the floating gate 6100 extends to intersect the active region 5041 in the first unit cell 1000, and the second floating part of the floating gate 6200 extends to intersect the active region 5042 in the second unit cell 2000. In the same manner, the second floating part of the floating gate 6300 extends to intersect the active region 5043 in the third unit cell 3000, and the second floating part of the floating gate 6400 extends to intersect the active region 5044 in the fourth unit cell 4000. As described above, the first and third unit cells 1000 and 3000 share the single selection gate 6201, and the second and fourth unit cells 2000 and 4000 share the single selection gate 6202.

The active region 5041 of the first unit cell 1000 includes a first impurity region 5311 that is disposed at one side of the second floating part of the floating gate 6100, a second impurity region 5321 that is at one side of the selection gate 6201, and a third impurity region 5331 that is disposed at the respective other sides of the selection gate 6201 and the second floating part of the floating gate 6100, i.e., between the selection gate 6201 and the floating gate 6100 intersecting the active region 5041. The first impurity region 5311 may act as a source region of the first unit cell 1000, and the second impurity region 5321 may act as a drain region of the first unit cell 1000.

The active region 5042 of the second unit cell 2000 includes a first impurity region 5312 that is disposed at one side of the second floating part of the floating gate 6200, a second impurity region 5322 that is disposed at one side of the selection gate 6202, and a third impurity region 5332 that is disposed at the respective other sides of the selection gate 6202 and the second floating part of the floating gate 6200, i.e., between the selection gate 6202 and the floating gate 6200 intersecting the active region 5042. The first impurity region 5312 may act as a source region of the second unit cell 2000, and the second impurity region 5322 may act as a drain region of the second unit cell 2000.

The active region 5043 of the third unit cell 3000 includes a first impurity region 5313 that is disposed at one side of the second floating part of the floating gate 6300, a second impurity region 5323 that is disposed at one side of the selection gate 6201, and a third impurity region 5333 that is disposed at the respective other sides of the selection gate 6201 and the second floating part of the floating gate 6300, i.e., between the selection gate 6201 and the floating gate 6300 intersecting the active region 5043. The first impurity region 5313 may act as a source region of the third unit cell 3000, and the second impurity region 5323 may act as a drain region of the third unit cell 3000.

The active region 5044 of the fourth unit cell 4000 includes a first impurity region 5314 that is disposed at one side of the second floating part of the floating gate 6400, a second impurity region 5324 that is disposed at one side of the selection gate 6202, and a third impurity region 5334 that is disposed at the respective other sides of the selection gate 6202 and the second floating part of the second floating part of the floating gate 6400, i.e., between the selection gate 6202 and the floating gate 6400 intersecting the active region 5044. The first impurity region 5314 may act as a source region of the fourth unit cell 4000, and the second impurity region 5324 may act as a drain region of the fourth unit cell 4000.

First contacts 5430 are disposed on the contact region 5200 to apply a bias voltage to the contact region 5200. Positions of the first contacts 5430 on the contact region 5200 may be changed in various embodiments.

A first source contact 5411 is disposed on the first impurity region 5311 of the first unit cell 1000, and a first drain contact 5421 is disposed on the second impurity region 5321 of the first unit cell 1000. A second source contact 5412 is disposed on the first impurity region 5312 of the second unit cell 2000, and a second drain contact 5422 is disposed on the second impurity region 5322 of the second unit cell 2000. A third source contact 5413 is disposed on the first impurity region 5313 of the third unit cell 3000, and a third drain contact 5423 is disposed on the second impurity region 5323 of the third unit cell 3000. A fourth source contact 5414 is disposed on the first impurity region 5314 of the fourth unit cell 4000, and a fourth drain contact 5424 is disposed on the second impurity region 5324 of the fourth unit cell 4000.

As described above, the layouts of the first and second unit cells 1000 and 2000 are line symmetric with respect to the vertical straight line 5000R, and the layouts of the third and fourth unit cells 3000 and 4000 are also line symmetric with respect to the vertical straight line 5000R. Thus, the first, second, third, and fourth unit cells 1000, 2000, 3000, and 4000 may have substantially the same cross-sectional structure. Accordingly, hereinafter, only a structure of the first unit cell 1000 will be described, and descriptions to the structures of the second to fourth unit cells 2000, 3000, and 4000 will be omitted for the simplicity of explanation.

Figure 12:
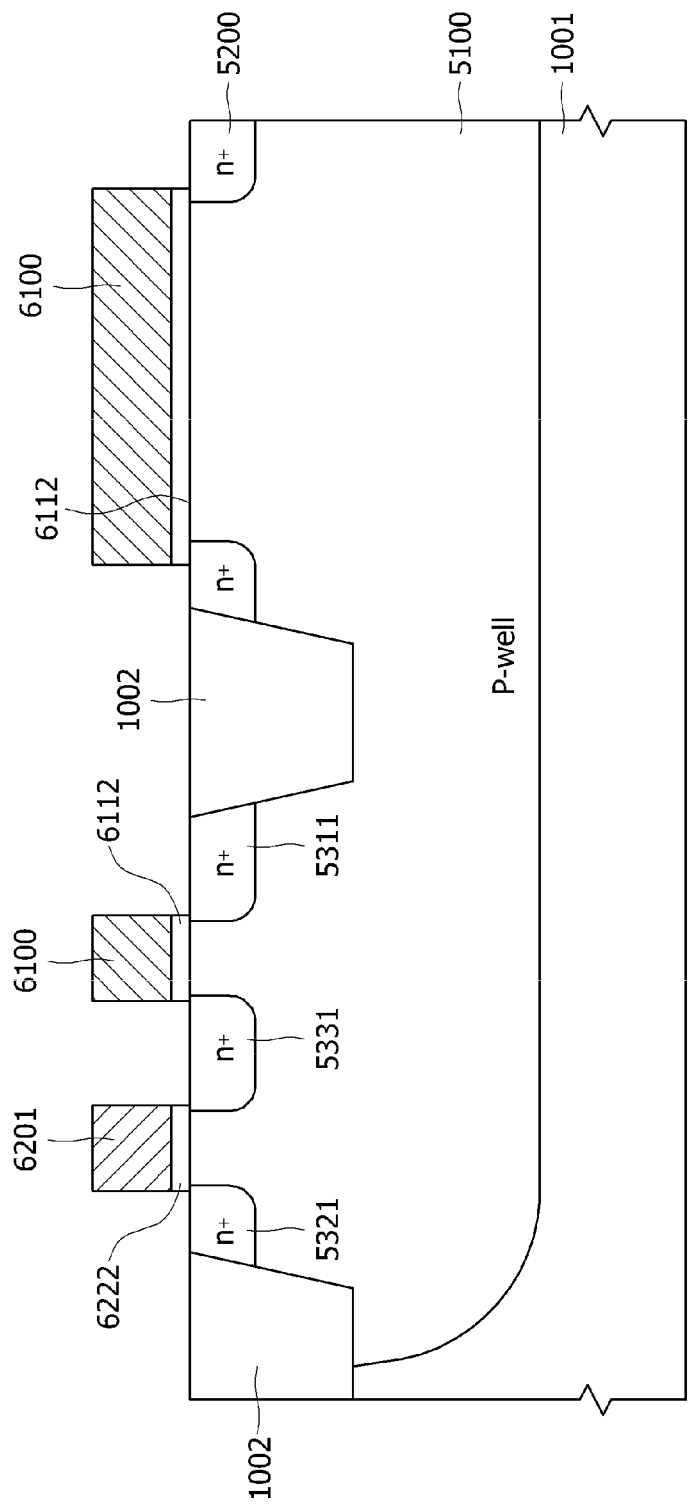
FIG. 12 is a cross-sectional view taken along a line III-III' of FIG. 11 according to an embodiment.

FIG. 12 is a cross-sectional view taken along a line III-III' of FIG. 11 according to an embodiment. Referring to FIGS. 11 and 12, the well region 5100 is disposed in a substrate 1001. In an embodiment, the well region 5100 is a P-well region. The substrate 1001 may be a semiconductor substrate such as a silicon substrate, but it is not limited thereto. The substrate 1001 may be a silicon-on-insulator (SOI) substrate or the like. In an embodiment, if the substrate 1001 is a P-type substrate, the well region 5100 may be omitted. In such an embodiment, the substrate 1001 acts as the well region 5100.

The active region 5041 and the contact region 5200 are disposed in the well region 5100. The active region 5041 and the contact region 5200 are defined by an isolation layer 1002. That is, the active region 5041 is separated from the contact region 5200 by the isolation layer 1002. In an embodiment, the isolation layer 1002 includes a trench isolation layer.

As described with reference to FIG. 11, the active region 5041 includes the first impurity region 5311, the second impurity region 5321, and the third impurity region 5331. The first, second, and third impurity regions 5311, 5321, and 5331 may have an opposite conductivity type to the well region 5100. In an embodiment, if the well region 5100 has the P-type conductivity, the first, second, and third impurity regions 5311, 5321 and 5331 have an N-type conductivity.

A first insulation layer 6112 is disposed on the well region 5100, and a portion (i.e., the first floating part) of the floating gate 6100 is disposed on the first insulation layer 6112. As described above, the contact region 5200 may be formed by implanting impurity ions into the well region 5100 using the floating gate 6100 as an ion implantation mask. Thus, the contact region 5200 may overlap with edges of the floating gate 6100, as illustrated in FIG. 12.

In an erase operation, if a positive erasure voltage is applied to the first impurity region 5311 (an N-type impurity region) acting as a source region and a ground voltage is applied to the well region 5100 and the contact region 5200, a coupling voltage close to the ground voltage may be induced at the floating gate 6100. Thus, the first unit cell 1000 may be erased by a Fowler-Nordheim (FN) tunneling mechanism, which is different from a band-to-band tunneling (BTBT) mechanism. In such a case, the coupling voltage induced at the floating gate 6100 may be determined by an coupling ratio of the first unit cell 1000.

As described above, both the well region 5100 and the contact region 5200 may be grounded to have the same electric potential during the erasure operation. Thus, during the erasure operation, the coupling ratio of the first unit cell 1000 may be proportional to a coupling capacitance between the well region 5100 and the floating gate 6100. That is, in order to improve an erasure efficiency of the first unit cell 1000, an area of overlap between the well region 5100 and the floating gate 6100 may be increased. Accordingly, the floating gate 6100 overlapping with the well region 5100 may be designed to have a rectangular shape rather than a comb-shaped configuration, as illustrated in FIG. 11. In an embodiment, the first insulation layer 6112 includes a silicon oxide layer, and the floating gate 6100 includes a polysilicon layer.

The floating gate 6100 and the first insulation layer 6112 on the well region 5100 crosses over the isolation layer 1002 and extends to intersect the active region 5041. Thus, the floating gate 6100 and the first insulation layer 6112 overlap with a first portion of the active region 5041. A second insulation layer 6222 is disposed on a second portion of the active region 5041 that is apart from the first portion, and the selection gate 6201 is disposed on the second insulation layer 6222.

In an embodiment, the selection gate 6201 includes the same material layer as the floating gate 6100. In an embodiment, the floating gate 6100 and the selection gate 6201 include a polysilicon layer. The selection gate 6201 and the second insulation layer 6222 intersect the active region 5041. That is, the selection gate 6201 and the second insulation layer 6222 overlap with the second portion of the active region 5041. As a result, the floating gate 6100 and the selection gate 6201 divide the active region 5041 into three regions. That is, the first impurity region 5311, the second impurity region 5321, and the third impurity region 5331 may be defined in the active region 5041 by the first and second portions of the active region 5041.

Figure 13:
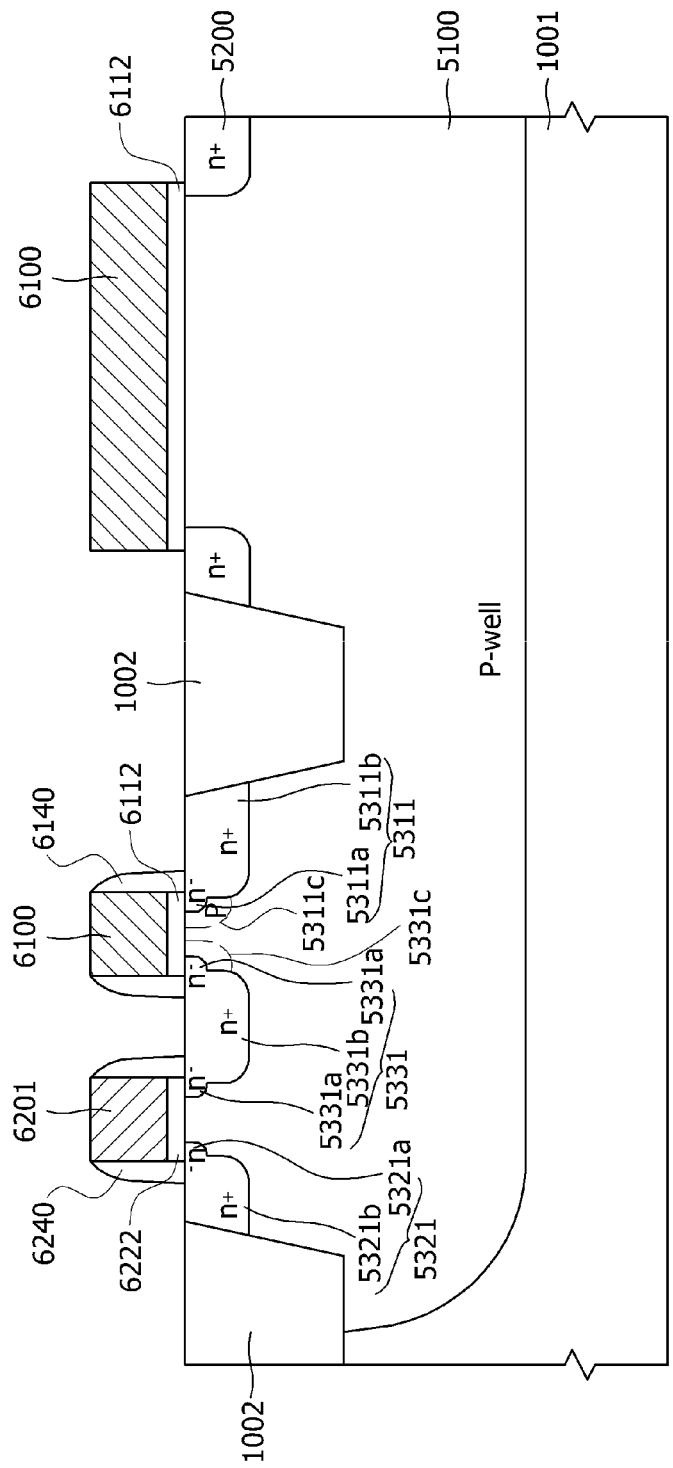
FIG. 13 is a cross-sectional view taken along the line III-III' of FIG. 11 according to another embodiment.

FIG. 13 is a cross-sectional view taken along the line III-III' of FIG. 11 according to another embodiment. In FIG. 13, the same reference numerals as used in FIG. 12 denote the same elements. Thus, descriptions to the same elements as illustrated in FIG. 12 will be omitted or briefly mentioned to avoid duplicate explanation.

Referring to FIGS. 11 and 13, a unit cell may be integrated on a substrate 1001 together with logic circuits using the same process. In general, impurity regions of transistors constituting the logic circuits may have a lightly-doped drain (LDD) structure. Thus, first to third impurity regions 5311, 5321, and 5331, which are simultaneously formed with the impurity regions of the transistors of the logic circuits, may also have the LDD structure.

In FIG. 13, the first impurity region 5311 includes a first extended impurity region 5311a and a first deep impurity region 5311b, and the second impurity region 5321 includes a second extended impurity region 5321a and a second deep impurity region 5321b. Similarly, the third impurity region 5331 includes a third extended impurity region 5331a and a third deep impurity region 5331b. Herein, the third extended impurity region 5331a is formed under both of a floating gate 6100 and a selection gate 6201. To form the first to third impurity regions 5311, 5321, and 5331 having the LDD structure, first gate spacers 6140 are formed on sidewalls of the floating gate 6100, and second gate spacers 6240 are formed on sidewalls of the selection gate 6201.

A first halo region 5311c and a second halo region 5331c are disposed under both edges of the floating gate 6100 to surround a sidewall of the first extended impurity region 5311a and a sidewall of the third extended impurity region 5331a under the floating gate 6100, respectively. Although not shown in the drawings, during formation of the first and second halo regions 5311c and 5331c, other halo regions may be formed under both edges of the selection gate 6201 to surround a sidewall of the second extended impurity region 5321a and a sidewall of the third extended impurity region 5331a under the selection gate 6201. Generally, the third extended impurity region 5331a under the floating gate 6100 may suppress generation of hot electrons. However, the second halo region 5331c surrounding the third extended impurity region 5331a under the floating gate 6100 may increase an electric field generated between the third impurity region 5331 and the well region 5100 under the floating gate 6100 during a program operation. Accordingly, a generation rate of electron-hole pairs in the vicinity of the third impurity region 5331 may be increased due to the presence of the second halo region 5331c. As a result, a program efficiency of the unit cell of FIG. 13 is improved.

Figure 14:
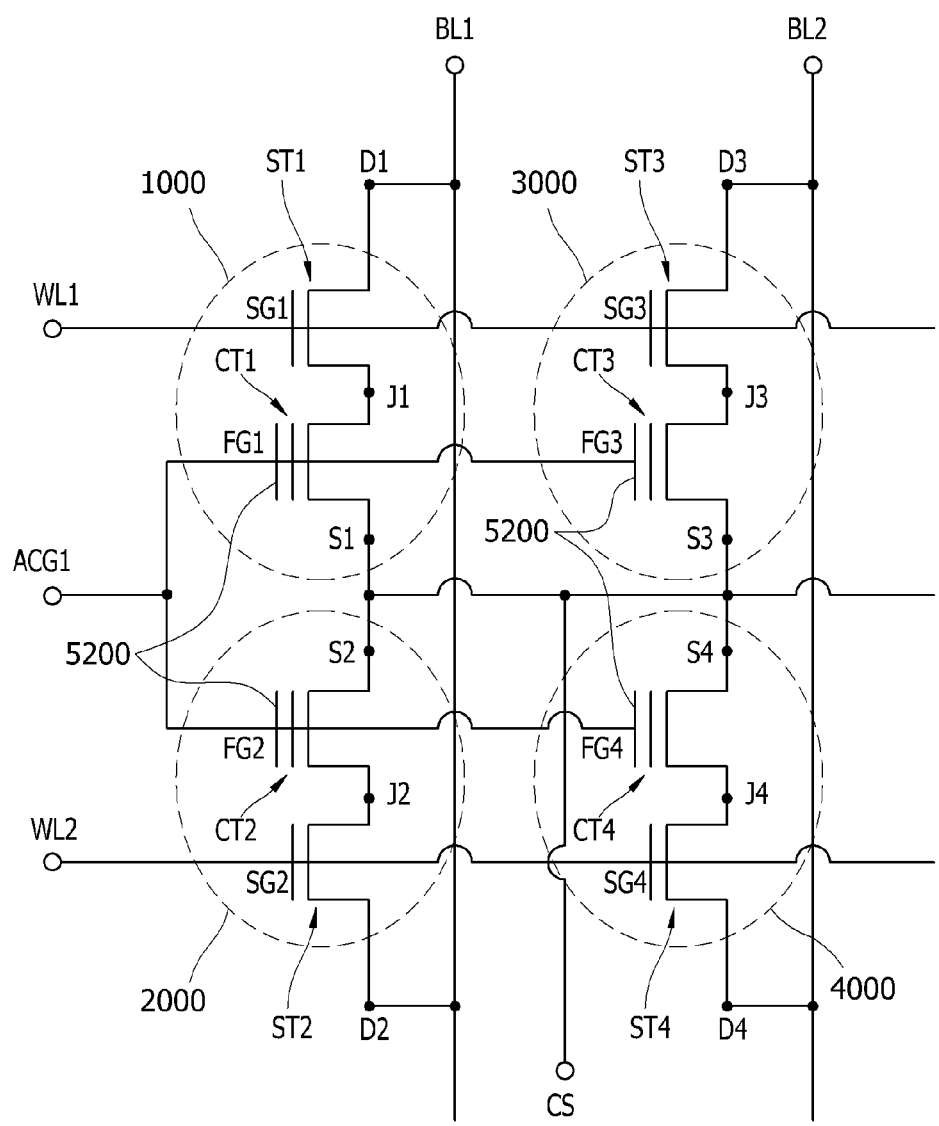
FIG. 14 is an equivalent circuit of the basic cell array portion shown in FIG. 11.

FIG. 14 is an equivalent circuit of the basic cell array portion shown in FIG. 11, and FIG. 15 is a table illustrating an operation of the basic cell array portion shown in FIG. 14. Referring to FIGS. 11 and 14, the first unit cell 1000 includes a first cell transistor CT1 and a first selection transistor ST1, which are serially connected to each other. The second unit cell 2000 includes a second cell transistor CT2 and a second selection transistor ST2, which are serially connected to each other. The third unit cell 3000 includes a third cell transistor CT3 and a third selection transistor ST3, which are serially connected to each other. The fourth unit cell 4000 includes a fourth cell transistor CT4 and a fourth selection transistor ST4, which are serially connected to each other.

The first cell transistor CT1 of the first unit cell 1000 is electrically connected in series to the second cell transistor CT2 of the second unit cell 2000. Similarly, the third cell transistor CT3 of the third unit cell 3000 is electrically connected in series to the fourth cell transistor CT4 of the fourth unit cell 4000.

The first cell transistor CT1 of the first unit cell 1000 may include the contact region 5200, the floating gate 6100, the first impurity region 5311, and the third impurity region 5331. The contact region 5200 acting as a control gate electrode of the first unit cell 1000 may be electrically connected to a first control gate line ACG1. The first impurity region 5311 may correspond to a first source terminal S1 of the first unit cell 1000, and the third impurity region 5331 may correspond to a first connection terminal 31.

The first selection transistor ST1 of the first unit cell 1000 may include the selection gate 6201, the second impurity region 5321, and the third impurity region 5331. The first cell transistor CT1 and the first selection transistor ST1 share the third impurity region 5331, that is, the first connection terminal 31. A first selection gate SG1 corresponding to the selection gate 6201 is electrically connected to a first word line WL1, and the second impurity region 5321 may act as a first drain terminal D1 of the first unit cell 1000.

The second cell transistor CT2 of the second unit cell 2000 may include the contact region 5200, the floating gate 6200, the first impurity region 5312, and the third impurity region 5332. The contact region 5200 acting as a control gate electrode of the second unit cell 2000 may be electrically connected to the first control gate line ACG1. The first impurity region 5312 may correspond to a second source terminal S2 of the second unit cell 2000, and the third impurity region 5332 may correspond to a second connection terminal 32. The second source terminal S2 is electrically connected to the first source terminal S1 of the first unit cell 1000.

The second selection transistor ST2 of the second unit cell 2000 may include the selection gate 6202, the second impurity region 5322, and the third impurity region 5332. The second cell transistor CT2 and the second selection transistor ST2 share the third impurity region 5332, that is, the second connection terminal 32. A second selection gate SG2 corresponding to the selection gate 6202 is electrically connected to a second word line WL2, and the second impurity region 5322 may act as a second drain terminal D2 of the second unit cell 2000. The first and second drain terminals D1 and D2 are electrically connected to a first bit line BL1.

The third cell transistor CT3 of the third unit cell 3000 may include the contact region 5200, the floating gate 6300, the first impurity region 5313, and the third impurity region 5333. The contact region 5200 acting as a control gate electrode of the third unit cell 3000 may be electrically connected to the first control gate line ACG1. The first impurity region 5313 may correspond to a third source terminal S3 of the third unit cell 3000, and the third impurity region 5333 may correspond to a third connection terminal 33.

The third selection transistor ST3 of the third unit cell 3000 may include the selection gate 6201, the second impurity region 5323, and the third impurity region 5333. The third cell transistor CT3 and the third selection transistor ST3 share the third impurity region 5333, that is, the third connection terminal 33. A third selection gate SG3 corresponding to the selection gate 6201 is electrically connected to the first word line WL1, and the second impurity region 5323 may act as a third drain terminal D3 of the third unit cell 3000. The first selection transistor ST1 of the first unit cell 1000 share the single selection gate 6201 with the third selection transistor ST3 of the third unit cell 3000. That is, the first selection gate SG1 and the third selection gate SG3 are connected to each other through the same selection gate line 6201.

The fourth cell transistor CT4 of the fourth unit cell 4000 may include the contact region 5200, the floating gate 6400, the first impurity region 5314, and the third impurity region 5334. The contact region 5200 acting as a control gate electrode of the fourth unit cell 4000 may be electrically connected to the first control gate line ACG1. The first impurity region 5314 may correspond to a fourth source terminal S4 of the fourth unit cell 4000, and the third impurity region 5334 may correspond to a fourth connection terminal 34. The fourth source terminal S4 is electrically connected to the third source terminal S3 of the third unit cell 3000.

The fourth selection transistor ST4 of the fourth unit cell 4000 may include the selection gate 6202, the second impurity region 5324, and the third impurity region 5334. The fourth cell transistor CT4 and the fourth selection transistor ST4 share the third impurity region 5334, that is, the fourth connection terminal 34. A fourth selection gate SG4 corresponding to the selection gate 6202 is electrically connected to the second word line WL2, and the second impurity region 5324 may act as a fourth drain terminal D4 of the fourth unit cell 4000. The third and fourth drain terminals D3 and D4 are electrically connected to a second bit line BL2. The second selection transistor ST2 of the second unit cell 2000 shares the single selection gate 6202 with the fourth selection transistor ST4 of the fourth unit cell 4000. That is, the second selection gate SG2 and the fourth selection gate SG4 are connected to each other through the same selection gate line 6202.

The first source terminal S1, the second source terminal S2, the third source terminal S3, and the fourth source terminal S4 are electrically connected to a common source line CS.

Referring to FIGS. 11, 14, and 15, a program operation of the first unit cell 1000 may be achieved by a hot carrier injection mechanism. In more detail, in order to program the first unit cell 1000 using the hot carrier injection mechanism, first and second positive program voltages $+V_{PP1}$ and $+V_{PP2}$ may be respectively applied to the first control gate line ACG1 and the first word line WL1, and a positive bit line voltage +V may be applied to the first bit line BL1. During the program operation, the common source line CS may be grounded, and the well region 5100 such as a P-type well region may be grounded.

As described above, the first unit cell 100 may have a structure that can be programmed using the hot carrier injection mechanism. Thus, a maximum program voltage, for example, the first positive program voltage $+V_{PP1}$ used in the program operation of the first unit cell 1000 with the hot carrier injection mechanism may be lower than that used in a program operation of a unit cell with a Fowler-Nordheim (FN) tunneling mechanism by about 2 V to 5 V. As a result, the power consumption of the EEPROM device including the first unit cell 1000 may be reduced. This may lead to reduction in the size or number of logic elements such as high voltage transistors which are used to drive the first positive program voltage $+V_{PP1}$.

Under the bias condition described above, in the program operation, a predetermined positive voltage may be induced at the first floating gate FG1 (6100) by a coupling ratio of the first unit cell 1000. During the program operation, the coupling ratio of the first unit cell 1000 may be proportional to a perimeter capacitance between the first floating gate FG1 (6100) and the control gate CG (i.e., the contact region 5200).

The first selection transistor ST1 may be turned on because the second positive program voltage $+V_{PP2}$ is applied to the first selection gate SG1 (6201) connected to the first word line WL1. Thus, the positive bit line voltage +V applied to the first bit line BL1 (i.e., the second impurity region 5321) may be transmitted to the first connection terminal 31 (i.e., the third impurity region 5331). The predetermined positive voltage induced at the first floating gate FG1 (6100) and the positive bit line voltage +V transmitted to the first connection terminal 31 (i.e., the third impurity region 5331) may generate a strong electric field under the first floating gate 6100. As a result, hot electrons may be generated and injected into the first floating gate 6100 by the strong electric field generated under the first floating gate 6100. Accordingly, a threshold voltage of the first cell transistor CT1 may be positively increased to program the first unit cell 1000.

An erasure operation of the first unit cell 1000 may be achieved by a Fowler-Nordheim (FN) mechanism. While the first unit cell 1000 is erased, the other unit cells including the second to fourth unit cells 2000, 3000, and 4000 are also erased. Specifically, the first unit cell 1000 may be erased by applying a positive erasure voltage $+V_{ee}$ to the common source line CS and a ground voltage to the first control gate line ACG1.

During the erasure operation, the first word line WL1 and the first bit line BL1 may be electrically floated or grounded, and the well region 5100 may be grounded. Thus, a coupling voltage close to the ground voltage may be induced at the first floating gate FG1 (6100) to generate a strong electric field between the first floating gate FG1 (6100) and the first source terminal S1 (i.e., the first impurity region 5311). Accordingly, electrons in the first floating gate FG1 (6100) may be injected into the first source terminal S1 (i.e., the first impurity region 5311) by the Fowler-Nordheim (FN) mechanism. As a result, a threshold voltage of the first cell transistor CT1 may be lowered to erase the data stored in the first unit cell 1000.

During the erasure operation, the other unit cells, for example, the second to fourth unit cells 2000, 3000, and 4000 may be simultaneously erased. This is because the second to fourth source terminals S2, S3, and S4 are electrically connected to the first source terminal S1 (i.e., the common source line CS) and the first to fourth unit cells 1000, 2000, 3000, and 4000 share the contact region 5200 connected to the first control gate line ACG1.

To achieve a read operation of the first unit cell 1000, a positive bit line voltage $+V_{BL}$ may be applied to the first bit line BL1, and a positive selection gate voltage $+V_{CC}$ may be applied to the first word line WL1. Further, a positive read voltage $+V_{read}$ may be applied to the first control gate line ACG1, and the well region 5100 and the common source line CS may be grounded. The positive read voltage $+V_{read}$ may be set to have a voltage level between a threshold voltage of the erased first unit cell 1000 and a threshold voltage of the programmed first unit cell 1000.

Under the bias condition described above in the read operation, the first selection transistor ST1 may be turned on by the positive selection gate voltage $+V_{CC}$ applied to the first word line WL1 that is connected to the first selection gate SG1 (6201). Accordingly, the positive bit line voltage $+V_{BL}$ may be transmitted to the third impurity region 5331 through the second impurity region 5321.

The first cell transistor CT1 may be turned on or turned off according to a threshold voltage thereof when the positive read voltage $+V_{read}$ is applied to the first control gate line ACG1 (5200). If the first cell transistor CT1 is programmed to have a threshold voltage higher than the positive read voltage $+V_{read}$, the first cell transistor CT1 may be turned off even though the positive read voltage $+V_{read}$ is applied to the first control gate line ACG1 (5200). In contrast, if the first cell transistor CT1 is erased to have a threshold voltage lower than the positive read voltage $+V_{read}$, the first cell transistor CT1 may be turned on when the positive read voltage $+V_{read}$ is applied to the first control gate line ACG1 (5200). Accordingly, a sense amplifier (not shown) connected to the first bit line BL1 can determine whether the first unit cell 1000 is programmed or erased by detecting a cell current that flows through the first bit line BL1.

Figure 16:
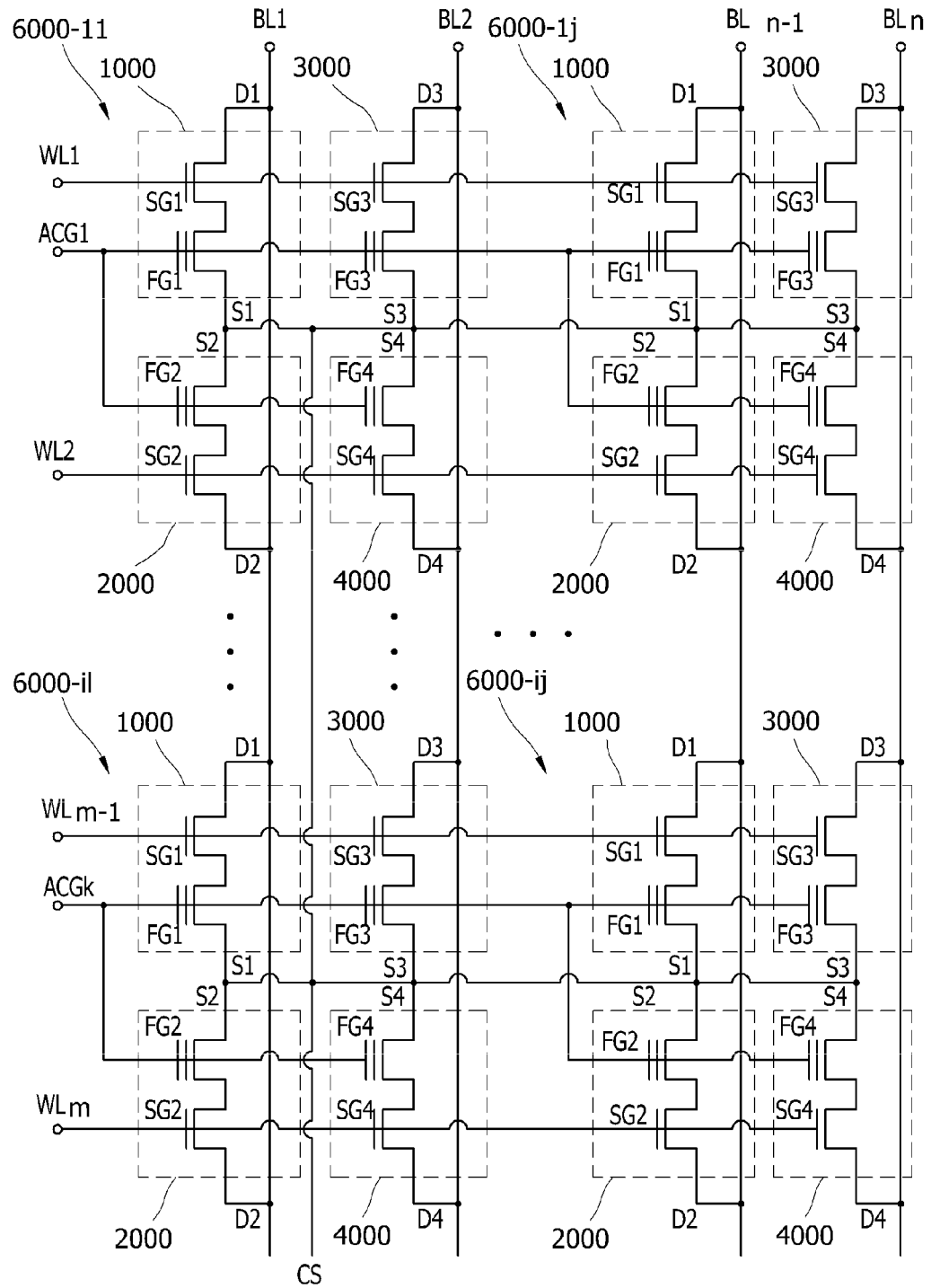
FIG. 16 is an equivalent circuit of a cell array including the basic cell array portion shown in FIG. 14.

FIG. 16 illustrates an equivalent circuit of a cell array including the basic cell array portion shown in FIG. 14. Referring to FIG. 16, the basic cell array portion shown in FIG. 14 is two-dimensionally arrayed in a (n/2)×(m/2) matrix to constitute a cell array of a single-layer gate EEPROM device according to an embodiment. That is, the basic cell array portion shown in FIG. 14 is repeatedly arrayed n/2 times in a row direction, and a plurality of basic cell array portions in the row direction is repeatedly arrayed m/2 times in a column direction.

The first to fourth unit cells 1000, 2000, 3000, and 4000 in a basic cell array portion 6000-11 located at an intersection of a first row and a first column include first to fourth floating gates FG1, FG2, FG3, and FG4, respectively. The contact region (5200 of FIG. 11) capacitively coupled to the first to fourth floating gates FG1, FG2, FG3, and FG4 in the basic cell array portion 6000-11 is electrically connected to a first control gate line ACG1.

The first to fourth unit cells 1000, 2000, 3000, and 4000 in a basic cell array portion 6000-1$j$ located at an intersection of the first row and a $j^{th}$ column include first to fourth floating gates FG1, FG2, FG3, and FG4, respectively. The contact region (5200 of FIG. 11) capacitively coupled to the first to fourth floating gates FG1, FG2, FG3, and FG4 in the basic cell array portion 6000-1$j$ is also electrically connected to the control gate line ACG1.

The first to fourth unit cells 1000, 2000, 3000, and 4000 in a basic cell array portion 6000-i1 located at an intersection of a $i^{th}$ row and the first column include first to fourth floating gates FG1, FG2, FG3, and FG4, respectively. The contact region (5200 of FIG. 11) capacitively coupled to the first to fourth floating gates FG1, FG2, FG3, and FG4 in the basic cell array portion 6000-i1 is electrically connected to a $k^{th}$ control gate line ACGk.

The first to fourth unit cells 1000, 2000, 3000, and 4000 in a basic cell array portion 6000-$ij$ located at an intersection of the $i^{th}$ row and the $i^{th}$ column include first to fourth floating gates FG1, FG2, FG3, and FG4, respectively. The contact region (5200 of FIG. 11) capacitively coupled to the first to fourth floating gates FG1, FG2, FG3, and FG4 in the basic cell array portion 6000-$ij$ is also electrically connected to the $k^{th}$ control gate line ACGk.

A first word line WL1 is electrically connected to the first selection gate SG1 and the third selection gate SG3 of each of the basic cell array portions 6000-11, . . . , 6000-1$j$ arrayed in the first row, and a second word line WL2 is electrically connected to the second selection gate SG2 and the fourth selection gate SG4 of each of the basic cell array portions 6000-11, . . . , 6000-1$j$ arrayed in the first row. In the same manner, a $(m-1)^{th}$ word line WLm-1 is electrically connected to the first selection gate SG1 and the third selection gate SG3 of each of the basic cell array portions 6000-i1, . . . , 6000-$ij$ arrayed in a $(m/2)^{th}$ row, and an $m^{th}$ word line WLm is electrically connected to the second selection gate SG2 and the fourth selection gate SG4 of each of the basic cell array portions 6000-i1, . . . , 6000-$ij$ arrayed in the $(m/2)^{th}$ row.

A first bit line BL1 is electrically connected to the first drain terminal D1 and the second drain terminal D2 of each of the basic cell array portions 6000-11, . . . , and 6000-i1 arrayed in the first column. A second bit line BL2 is electrically connected to the third drain terminal D3 and the fourth drain terminal D4 of each of the basic cell array portions 6000-11, . . . , and 6000-i1 arrayed in the first column. In the same manner, a $(n-1)^{th}$ bit line BLn-1 is electrically connected to the first drain terminal D1 and the second drain terminal D2 of each of the basic cell array portions 6000-1$j$, . . . , and 6000-$ij$ arrayed in a $(n/2)^{th}$ column, and an $n^{th}$ bit line BLn is electrically connected to the third drain terminal D3 and the fourth drain terminal D4 of each of the basic cell array portions 6000-11, . . . , and 6000-i1 arrayed in the $(n/2)^{th}$ column.

A common source line CS is electrically connected to the source terminals S1, S2, S3, and S4 of each of the basic cell array portions 6000-11, . . . , 6000-1$j$, 6000-i1, . . . , and 6000-$ij$ arrayed in the (n/2)×(m/2) matrix. In FIG. 9, i, j, k, n, and m are each positive integers.

FIG. 17 is a table illustrating an operation of the cell array shown in FIG. 16. In an embodiment, a single unit cell of a single-layer gate EEPROM device is selectively programmed, and data stored in the single unit cell is selectively read out, whereas all the unit cells in the cell array are simultaneously erased during an erasure operation.

The program operation may be achieved using a hot carrier injection mechanism, and the erasure operation may be achieved using a Fowler-Nordheim (FN) tunneling mechanism. Hereinafter, a method of operating a single-layer gate EEPROM device according to an embodiment will be described in conjunction with an illustrative example in which the first unit cell 1000 in FIG. 16 is selectively programmed and read out.

Referring to FIGS. 16 and 17, the first unit cell 1000 located at an intersection of a first row and a first column is selectively programmed by applying a first positive program voltage $+V_{PP1}$ to the first control gate line ACG1, a second positive program voltage $+V_{PP2}$ to the first word line WL1, and a positive bit line voltage +V to the first bit line BL1. During the program operation, the common source line CS is grounded. Under the above bias condition, the first unit cell 1000 of the basic cell array portion 6000-11 may be selectively programmed by the hot carrier injection mechanism, as described with reference to FIGS. 5 and 6.

During the program operation, the non-selected second unit cell 2000 connected to the second word line WL2 and the first bit line BL1 is not programmed because the second word line WL2 is grounded to turn off the selection transistor of the non-selected second unit cell 2000 even though the first positive program voltage $+V_{PP1}$ is applied to the first control gate line ACG1 and the positive bit line voltage +V is applied to the first bit line BL1.

During the program operation, the first and second unit cells 1000 and 2000 of each of the other basic cell array portions 6000-21, . . . , and 6000-i1 in the first column are not programmed because non-selected word lines, i.e., the third to $m^{th}$ word lines WL3, . . . , and WLm, are grounded.

Further, during the program operation, the non-selected third unit cell 3000 connected to the second bit line BL2 and the first word line WL1 is not programmed because no bias is applied to the second bit line BL2, e.g., a ground voltage is applied to the second bit line BL2, even though the first positive program voltage $+V_{PP1}$ is applied to the first control gate line ACG1 and the second positive program voltage $+V_{PP2}$ is applied to the first word line WL1. During the program operation, the first and third unit cells 1000 and 3000 of each of the other basic cell array portions 6000-12, . . . , and 6000-1$j$ in the first row are not programmed because non-selected bit lines, i.e., the third to $n^{th}$ bit lines BL3, . . . , and BLn, are grounded.

Furthermore, during the program operation, the non-selected fourth unit cell 4000 connected to the second bit line BL2 and the second word line WL2 is not programmed because no bias is applied to the second bit line BL2 and the second word line WL2, e.g., a ground voltage is applied to the second bit line BL2 and the second word line WL2, even though the first positive program voltage $+V_{PP1}$ is applied to the first control gate line ACG1 connected to the non-selected fourth unit cell 4000.

An erasure operation of the single-layer gate EEPROM device according to an embodiment may be achieved by applying a positive erasure voltage $+V_{ee}$ to the common source line CS and a ground voltage to the first control gate line ACG1. Under the above bias condition, all the unit cells 1000, 2000, 3000 and 4000 in the first row may be erased by a Folwer-Nordheim (FN) tunneling current that flows through the first insulation layer (6112 of FIG. 12 or 13) between the first control gate line ACG1 and the floating gates FG1~FG4.

During the erasure operation, all the bit lines BL1, . . . , and BLn and all the word line WL1, . . . , and WLm may be grounded or floated, and the well region (5100 of FIG. 11, 12 or 13) may be grounded. In an embodiment, during the erasure operation, all the control gate lines ACG1, . . . , and ACGk may be grounded, and the positive erasure voltage $+V_{ee}$ may be applied to the common source line CS. In such a case, the unit cells in all the basic cell array portions 6000-11, . . . , 6000-1j, . . . , 6000-i1, . . . , and 6000-ij may be simultaneously erased.

Data stored in the first unit cell 1000 located at an intersection of the first row and the first column may be selectively read out by applying a positive bit line voltage $+V_{BL}$ to the first bit line BL1, a positive selection gate voltage $+V_{CC}$ to the first word line WL1, and a positive read voltage $+V_{read}$ to the first control gate line ACG1.

During the read operation, the common source line CS may be grounded. The positive read voltage $+V_{read}$ may be set to have a voltage level between a threshold voltage of the programmed unit cell and a threshold voltage of the erased unit cell. Under the above bias condition, a sense amplifier (not shown) connected to the first bit line BL1 can determine whether the selected first unit cell 1000 is programmed or erased by detecting a cell current that flows through the first bit line BL1.

During the read operation, data stored in the non-selected second unit cell 2000 connected to the first bit line BL1 and the second word line WL2 is not read out because the second word line WL2 is grounded to turn off the selection transistor of the non-selected second unit cell 2000, even though the positive bit line voltage $+V_{BL}$ is applied to the first bit line BL1 and the positive read voltage $+V_{read}$ is applied to the first control gate line ACG1. During the read operation, the remaining word lines WL3~WLm may be also grounded. Thus, data stored in unit cells connected to the remaining word lines WL3~WLm are not read out.

Further, during the read operation, data stored in the non-selected third unit cell 3000 connected to the second bit line BL2 and the first word line WL1 is not read out because the second bit line BL2 is floated or grounded, even though the positive selection gate voltage $+V_{CC}$ applied to the first word line WL1 and the positive read voltage $+V_{read}$ is applied to the first control gate line ACG1. During the read operation, the remaining bit lines BL3~BLn may also be floated or grounded. Thus, data stored in unit cells connected to the remaining bit lines BL3~BLn are not read out.

Furthermore, during the read operation, data stored in the non-selected fourth unit cell 4000 connected to the second bit line BL2 and the second word line WL2 is not read out because the second bit line BL2 and the second word line WL2 are floated or grounded, even though the positive read voltage $+V_{read}$ is applied to the first control gate line ACG1.

Embodiments of the present invention have been disclosed above for illustrative purposes. Those skilled in the art will appreciate that various modifications, additions, and substitutions are possible without departing from the scope and spirit of the present invention as disclosed in the accompanying claims.

What is claimed is:

1. A cell array of a single-layer gate electrically erasable programmable read-only memory (EEPROM) device, the cell array comprising:
   a substrate; and
   a plurality of unit cells sharing an N-well region in the substrate,
   wherein each of the plurality of unit cells comprises:
      a floating gate including a first part disposed over the N-well region and a second part extending from the first part in a first direction, the second part having a stripe shape and disposed over a P-well region, the N-well region being separate from the P-well region;
      a selection gate spaced apart from the floating gate and disposed over the P-well region and parallel with the second part of the floating gate; and
      an active region disposed in the P-well region and parallel with a second direction substantially perpendicular to the first direction, the active region intersecting the floating gate and the selection gate,
   wherein the active region includes a first n+ impurity region disposed at one side of the second part of the floating gate, a second n+ impurity region disposed at one side of the selection gate, and a third n+ impurity region disposed at the respective other sides of the selection gate and the second part of the floating gate,
   wherein the N-well region includes a p+ contact region that partially overlaps with the first part of the floating gate,
   wherein the plurality of unit cells comprises first to fourth unit cells, and
   wherein the first and second unit cells are disposed to be symmetric with respect to a straight line in the second direction, the first and third unit cells are disposed to be symmetric with respect to a straight line in the first direction, and the first and fourth unit cells are disposed to be point symmetric.

2. The cell array of claim 1, wherein the first part of the floating gate has a comb shape.

3. The cell array of claim 1, wherein each of the first, second, and third n+ impurity regions has a lightly-doped drain (LDD) structure including an extended impurity region and a deep impurity region.

4. The cell array of claim 3, further comprising halo regions surrounding respective extended impurity regions of the first, second, and third n+ impurity regions.

5. A cell array of a single-layer gate EEPROM device, the cell array comprising:
   a plurality of unit cells arrayed over a substrate in rows and columns, each of the unit cells including a selection transistor and a cell transistor serially connected to each other and including a drain terminal, a selection gate, a floating gate, a control gate electrode, and a source terminal;
   a plurality of bit lines connected to the plurality of unit cells, each of the bit lines being electrically connected to drain terminals of unit cells arrayed in a corresponding one of the columns;
   a plurality of word lines connected to the plurality of unit cells, each of the word lines being electrically connected to selection gates of unit cells arrayed in a corresponding one of the rows;

a plurality of control gate lines connected to the plurality of unit cells, each of the control gate lines being electrically connected to control gate electrodes of unit cells arrayed in two adjacent ones of the rows; and a common source line connected to the source terminals of the plurality of unit cells, wherein each of the unit cells includes an N-well region, a P-well region, and an active region disposed in the substrate;

wherein the floating gate of each unit cell includes a first part disposed over the N-well region and a second part extending from the first part in a first direction, the second part having a stripe shape and disposed over the P-well region;

wherein the selection gate of each unit cell is spaced apart from the floating gate and disposed over the P-well region to be parallel with the second part of the floating gate;

wherein the active region of each unit cell is disposed to be parallel with a second direction substantially perpendicular to the first direction and to intersect the selection gate and the second part of the floating gate;

wherein the active region of each unit cell includes a first n+ impurity region disposed at one side of the second part of the floating gate, a second n+ impurity region disposed at one side of the selection gate, and a third n+ impurity region disposed at the respective other sides of the selection gate and the second part of the floating gate;

wherein the N-well region includes a p+ contact region that partially overlaps with the first part of the floating gate, wherein the plurality of unit cells comprises first to fourth unit cells, and wherein the first and second unit cells are disposed to be symmetric with respect to a straight line in the second direction, the first and third unit cells are disposed to be symmetric with respect to a straight line in the first direction, and the first and fourth unit cells are disposed to be point symmetric.

6. A cell array of a single-layer gate EEPROM device, the cell array comprising:

a substrate in which a single well region is disposed;

first, second, third, and fourth unit cells disposed over the single well region; and a contact region disposed in the single well region and shared by the first, second, third, and fourth unit cells, wherein each of the first, second, third, and fourth unit cells comprises:

a floating gate including a first part disposed over the single well region to overlap with a portion of the contact region, and a second part extending from the first part, the second part not overlapping with the contact region;

a selection gate disposed over the single well region to be spaced apart from the second part of the floating gate; and an active region disposed in the single well region and intersecting the selection gate and the second part of the floating gate, wherein the active region includes a first impurity region disposed at one side of the second part of the floating gate, a second impurity region disposed at one side of the selection gate, and a third impurity region disposed at the respective other sides of the selection gate and the second part of the floating gate, wherein the first and third unit cells are disposed at a left side of a vertical straight line in a plan view, and the second and fourth unit cells are disposed at a right side of the vertical straight line in the plan view, and wherein the first and third unit cells share a first selection gate line, and the second and fourth unit cells share a second selection gate line that is different from the first selection gate line.

7. The cell array of claim 6:

wherein the first unit cell and the second unit cell are disposed to be symmetric with respect to the vertical straight line; and wherein the third unit cell and the fourth unit cell are disposed to be symmetric with respect to the vertical straight line.

\* \* \* \* \*